(12) United States Patent
Tanaka

(10) Patent No.: US 9,281,191 B2
(45) Date of Patent: Mar. 8, 2016

(54) SEMICONDUCTOR DEVICE MANUFACTURING METHOD

(71) Applicant: Renesas Electronics Corporation, Kanagawa (JP)

(72) Inventor: Toshihiko Tanaka, Kanagawa (JP)

(73) Assignee: RENESAS ELECTRONICS CORPORATION, Kanagawa (JP)

( * ) Notice: Subject to any disclaimer, the term of this patent is extended or adjusted under 35 U.S.C. 154(b) by 136 days.

(21) Appl. No.: 14/149,969

(22) Filed: Jan. 8, 2014

(65) Prior Publication Data

US 2014/0206111 A1 Jul. 24, 2014

(30) Foreign Application Priority Data

Jan. 22, 2013 (JP) ................. 2013-009345

(51) Int. Cl.
| | |
|---|---|
| H01L 21/027 | (2006.01) |
| H01L 21/308 | (2006.01) |
| H01L 21/66 | (2006.01) |
| G03F 9/00 | (2006.01) |
| G03F 7/20 | (2006.01) |
| G03F 7/00 | (2006.01) |
| H01L 27/02 | (2006.01) |
| G06F 1/22 | (2006.01) |

(52) U.S. Cl.
CPC .......... *H01L 21/0274* (2013.01); *G03F 7/0035* (2013.01); *G03F 7/70333* (2013.01); *G03F 9/7026* (2013.01); *G06F 1/22* (2013.01); *H01L 22/12* (2013.01); *H01L 27/0207* (2013.01); *H01L 2924/0002* (2013.01)

(58) Field of Classification Search
CPC ....... G03F 7/22; G03F 9/7019; G03F 9/7023; G03F 9/7026; G03F 7/70333; H01L 22/12; H01L 21/0274; H01L 21/3083
USPC ..................................... 438/16, 694
See application file for complete search history.

(56) References Cited

U.S. PATENT DOCUMENTS

| | | | | |
|---|---|---|---|---|
| 4,869,999 | A * | 9/1989 | Fukuda et al. | 430/311 |
| 4,937,619 | A * | 6/1990 | Fukuda et al. | 355/53 |
| 5,194,893 | A * | 3/1993 | Nishi | 355/53 |
| 5,255,050 | A * | 10/1993 | Kitagawa | 355/53 |
| 5,303,002 | A * | 4/1994 | Yan | 355/53 |
| 6,235,434 | B1 | 5/2001 | Sweeney et al. | |
| 6,829,040 | B1 * | 12/2004 | Kye et al. | 355/53 |

(Continued)

FOREIGN PATENT DOCUMENTS

| | | |
|---|---|---|
| JP | 63-042122 | 2/1988 |
| JP | 06-349715 | 12/1994 |

(Continued)

*Primary Examiner* — Mary Wilczewski
*Assistant Examiner* — Erik T Peterson
(74) *Attorney, Agent, or Firm* — Young & Thompson

(57) ABSTRACT

To improve the performance of a semiconductor device, a semiconductor device manufacturing method includes an exposing process of performing pattern exposure of a resist film formed on a substrate by using EUV light reflected from a front surface of an EUV mask as a reflective mask. In this exposing process, the resist film is subjected to pattern exposure by repeating a process of irradiating the resist film with the EUV light by changing a focal position of the EUV light with which the resist film is irradiated, along a film thickness direction of the resist film. After this exposing process, the resist film subjected to pattern exposure is developed to form a resist pattern.

5 Claims, 26 Drawing Sheets

(56) References Cited

U.S. PATENT DOCUMENTS

| | | |
|---|---|---|
| 2003/0067598 A1 | 4/2003 | Tomie |
| 2004/0057107 A1 | 3/2004 | Yun et al. |
| 2005/0236584 A1* | 10/2005 | Tsuji ........................ 250/492.1 |
| 2006/0091328 A1* | 5/2006 | Kanazawa ................ 250/504 R |
| 2007/0092840 A1 | 4/2007 | Chen et al. |
| 2008/0180696 A1* | 7/2008 | Sugawara ..................... 356/624 |
| 2008/0212060 A1 | 9/2008 | Greif-Wuestenbecker et al. |
| 2009/0307649 A1* | 12/2009 | Pramanik et al. ............... 716/19 |
| 2012/0240086 A1* | 9/2012 | Song et al. ...................... 716/53 |
| 2013/0017475 A1* | 1/2013 | Terasawa et al. ................. 430/5 |

FOREIGN PATENT DOCUMENTS

| | | |
|---|---|---|
| JP | 09-306829 | 11/1997 |
| JP | 2002-532738 | 10/2002 |
| JP | 2003-114200 | 4/2003 |
| JP | 2007-123897 | 5/2007 |
| JP | 2009-507251 | 2/2009 |

\* cited by examiner

SEMICONDUCTOR DEVICE MANUFACTURING METHOD

CROSS-REFERENCE TO RELATED APPLICATION

The present application claims priority from Japanese Patent Application No. 2013-009345 filed on Jan. 22, 2013 the content of which is hereby incorporated by reference into this application.

BACKGROUND

The present invention relates to a semiconductor device manufacturing method. The present invention can be suitably used in a method of manufacturing a semiconductor device including a photolithography process using, for example, a photo mask.

In a semiconductor device manufacturing process, a photolithography process is performed, in which a semiconductor substrate is irradiated with exposure light via a photo mask (a mask) where a circuit pattern is formed and a circuit pattern is transferred onto a photoresist film (a resist film) formed on the semiconductor substrate. Also, to increase resolution by shortening the wavelength of exposure light, EUV (Extreme Ultraviolet) lithography using EUV light with a wavelength of 13.5 nm, which is far shorter than the wavelength of an argon fluoride (ArF) excimer laser (193 nm), is being developed.

EUV light is absorbed in almost all substances. Therefore, in EUV lithography, an absorber pattern is formed on a mask blank having a front surface to which a multilayer reflective film is formed, thereby configuring an EUV mask. If a defect having a very slight height on the order of a fraction of the wavelength of exposure light (such a defect is hereinafter referred to as a phase defect) occurs in this EUV mask, a transfer defect occurs in the pattern transferred to the resist film.

A method of handling a phase defect occurring in the EUV mask includes the following three processes. A first process is a process of inspecting the phase defect. A second process is a process of estimating a correction amount of an absorber pattern, etc. A third process is a process of correcting the absorber pattern according to the estimation.

In the first process, an inspection of the mask blank before the absorber pattern is formed and an inspection of the EUV mask after the absorber pattern is formed are performed. Of these inspections, as a method of inspecting a mask blank, an exposure-light (at wavelength or Actinic) defect inspecting method has been provided in which a phase defect is detected by using EUV light having the same wavelength as the wavelength for use in exposure.

Japanese Patent Application Laid-Open Publication No. 2003-114200 (Patent Document 1) describes a method using a dark field as an exposure-light defect inspecting method. Japanese Patent Application Laid-Open Publication No. 06-349715 (Patent Document 2) describes an X-ray microscopic method using a bright field as an exposure-light defect inspecting method. Also, United States Patent Application Publication No. 2004/0057107 (Patent Document 3) describes a method of concurrently using a dark field and a bright field as an exposure-light defect inspecting method, in which a phase defect is detected by using the dark field and the phase defect is identified in the bright field using a Fresnel-zone plate.

In the second process, a correction amount of the absorber pattern and so forth are estimated. Japanese Patent Application Laid-Open Publication (Translation of PCT Application) No. 2009-507251 (Patent Document 4) describes a method of determining an intensity distribution in an image plane of a projection exposure system based on AIMS (Aerial Image Measurement System).

In the third process, an absorber pattern is corrected. Japanese Patent Application Laid-Open Publication (Translation of PCT Application) No. 2002-532738 (Patent Document 5) describes a method of changing an absorber pattern on the front surface of the mask blank adjacent to the phase defect.

On the other hand, in other lithography techniques than EUV lithography, multifocal superposing exposure may be performed, in which multiple exposure is performed while changing a focal position. Japanese Patent Application Laid-Open Publication No. 63-42122 (Patent Document 6) and Japanese Patent Application Laid-Open Publication No. 2007-123897 (Patent Document 7) describe an exposure method called FLEX (Focus Latitude EXposure Method) as an exposure method of performing multiple exposure while changing a focal position. Also, Japanese Patent Application Laid-Open Publication No. 09-306829 (Patent Document 8) describes technology in a scanning exposure method of performing exposure while scanning a reticle along an in-plane direction of a substrate, in which the position of the reticle is repeatedly displaced in a minute distance range along a direction orthogonal to the in-plane direction of the substrate.

SUMMARY

According to studies by the inventor, the following has been found.

In EUV lithography, even a minute phase defect may affect the pattern dimension of a pattern to be formed. For this reason, as described above, the exposure-light defect inspecting method such as the Actinic defect inspecting method is required to be performed as a defect inspection.

However, even if the defect inspection by the Actinic defect inspecting method is made, inspecting a minute phase defect is not easy, and the light amount of the light source is not sufficient, thereby disadvantageously increasing the time required for the defect inspection.

Moreover, when part of the phase defect penetrates under the absorber pattern, that part is shadowed by the absorber pattern. Therefore, the position of the phase defect, the influence of the phase defect on the pattern dimension of the pattern to be formed, and others cannot be easily identified. For this reason, even if the exposure-light defect inspecting method such as the Actinic defect inspecting method is performed, the influence of the phase defect on the pattern dimension of the pattern to be formed in EUV lithography cannot be easily reduced.

On the other hand, in lithography techniques other than EUV lithography, an exposure method of multiple exposure by changing the focal position has been suggested, for example, as the technologies described in Patent Documents 6 to 8.

However, in EUV lithography using an EUV mask as a reflective mask or an off-telecentric optical system, the exposure methods described in Patent Documents 6 to 8 are not to solve the problem, which is unique to EUV lithography, of reducing the influence of the phase defect on the pattern dimension of the pattern to be formed. For this reason, in the exposure methods described in Patent Documents 6 to 8, the influence of the phase defect on the pattern dimension of the pattern to be formed in EUV lithography cannot be easily reduced. Furthermore, a positional shift occurs in the pattern to be transferred onto the resist film formed on the semiconductor substrate by exposure, and shape accuracy of a circuit pattern of a semiconductor device to be manufactured is decreased, thereby decreasing the performance of the semiconductor device.

The above and other preferred aims and novel characteristics of the present invention will be apparent from the description of the present specification and the accompanying drawings.

According to an embodiment of the present invention, a method of manufacturing a semiconductor device of the present invention includes an exposing process of performing pattern exposure of a resist film formed on a substrate by using EUV light reflected from a front surface of an EUV mask as a reflective mask. In this exposing process, the resist film is subjected to pattern exposure by repeating a process of irradiating the resist film with the EUV light by changing a focal position of the EUV light with which the resist film is irradiated, along a film thickness direction of the resist film. After this exposing process, the resist film subjected to pattern exposure is developed to form a resist pattern.

According to the embodiment of the present invention, performance of a semiconductor device can be improved.

BRIEF DESCRIPTIONS OF THE DRAWINGS

DETAILED DESCRIPTION OF THE EXEMPLARY EMBODIMENTS

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof.

Also, in the embodiments described below, when referring to the number of elements (including number of pieces, values, amount, range, and the like), the number of the elements is not limited to a specific number unless otherwise stated or except the case where the number is apparently limited to a specific number in principle. The number larger or smaller than the specified number is also applicable.

Further, in the embodiments described below, it goes without saying that the components (including element steps) are not always indispensable unless otherwise stated or except the case where the components are apparently indispensable in principle. Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value and the range described above.

Also, components having the same function are denoted by the same reference symbols throughout the drawings for describing the embodiments, and a repetitive description thereof is omitted. In addition, the description of the same or similar portions is not repeated in principle unless particularly required in the following embodiments.

Also, in some drawings used in the embodiments, hatching is used even in a plan view so as to make the drawings easy to see.

(First Embodiment)

A semiconductor device manufacturing process of a first embodiment will be described with reference to the drawings. The semiconductor device manufacturing process of a first embodiment includes an exposing process of performing pattern exposure of a resist film formed on a main surface of a semiconductor substrate (wafer) by using extreme ultraviolet (EUV) light as exposure light.

<Exposing Apparatus>

First, an exposing apparatus for performing the exposing process included in the semiconductor device manufacturing process of the first embodiment is described. This exposing apparatus is a scan-type exposing apparatus which performs pattern exposure on a resist film formed on a main surface of a semiconductor substrate by using EUV light as exposure light.

In EUV lithography, exposure by an optical system called a non-telecentric optical system (an off-telecentric optical system) is performed. In the off-telecentric system, exposure light enters a wafer from a direction slightly tilted with respect to a direction perpendicular to a front surface of the wafer.

Figure 1:
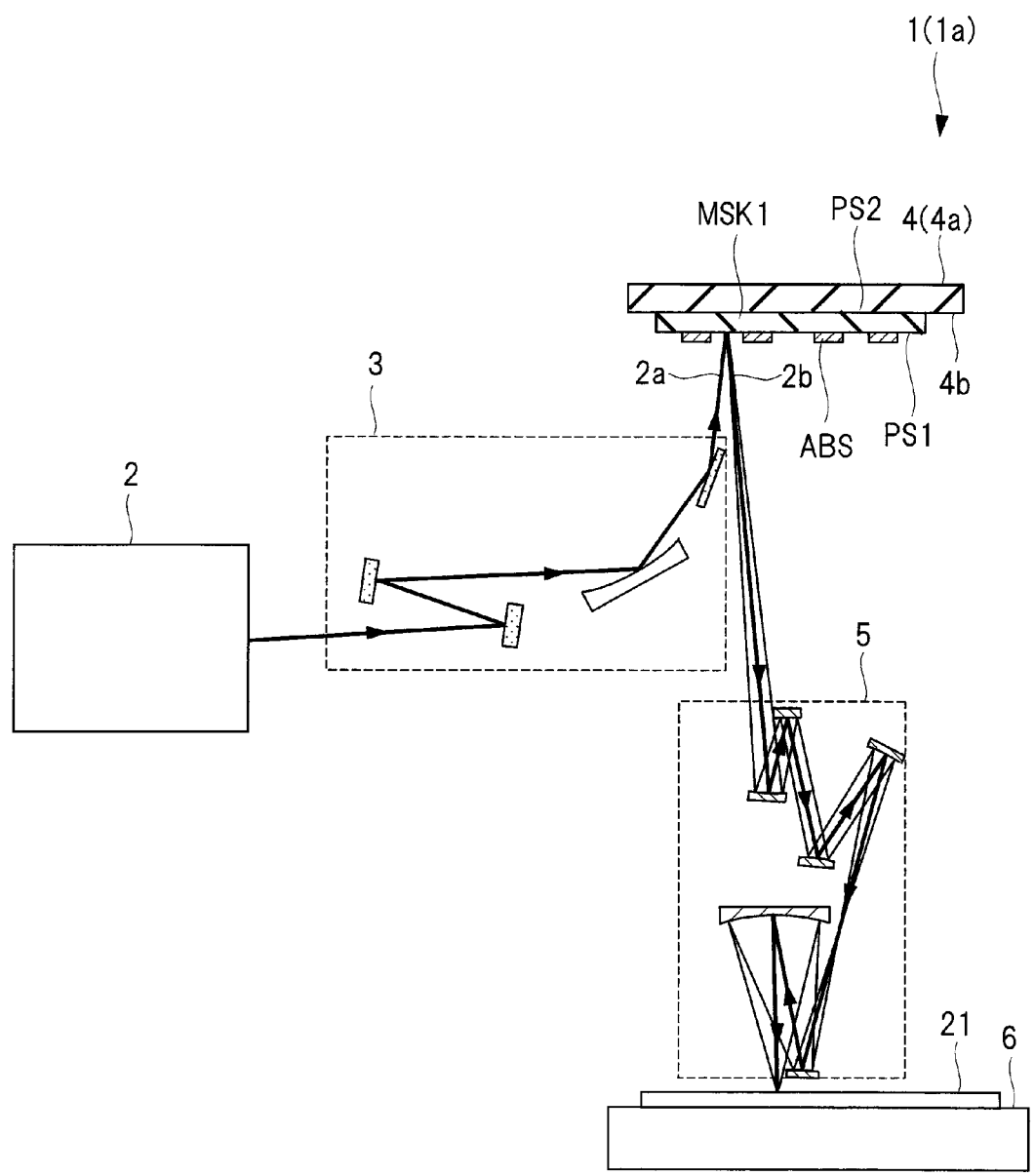
FIG. 1 is a diagram schematically illustrating a structure of an exposing apparatus of a first embodiment.

FIG. 1 is a diagram schematically illustrating the structure of the exposing apparatus of the first embodiment.

As illustrated in FIG. 1, an exposing apparatus 1 has an exposure mechanism unit 1a. The exposure mechanism unit 1a is provided with an EUV light source 2. Exposure light 2a as EUV light having a center wavelength of 13.5 nm emitted from the EUV light source 2 is applied, via a reflective illumination optical system 3 formed of a multilayer film reflecting mirror, onto a pattern surface (a front surface or a first main surface) PS1 of an EUV mask MSK1 held inside the exposure mechanism unit 1a. The EUV mask MSK1 has the pattern surface PS1 in which an exposure pattern is formed and a back surface (a second main surface) PS2 opposite to the pattern surface PS1.

The EUV mask MSK1 is held by a mask stage (a holding unit) 4. Specifically, the EUV mask MSK1 is held by the mask stage 4, as being in contact with a lower surface (a front surface) 4b of an electrostatic fastener 4a provided on the mask stage to be electrostatically absorbed onto the electrostatic fastener 4a.

EUV light is absorbed into a mask substrate and cannot pass therethrough because of its very short wavelength. Thus, a transmission-type mask allowing exposure light to pass therethrough cannot be used as an EUV mask. Therefore, as the EUV mask MSK1, a reflective mask is used which has an exposure pattern including a multilayer reflective film (omitted in the drawing) and an absorber pattern ABS formed on the pattern surface PS1 and reflects EUV light as exposure light. The structure of the EUV mask MSK1 will be described in detail below with reference to FIG. 3.

The exposure light 2a applied onto the pattern surface PS1 is reflected by the pattern surface PS1. Then, reflected light 2b reflected by the pattern surface PS1 passes through a reduced projection optical system 5 formed of a multilayer film reflecting mirror to be projected onto a wafer (a substrate or a semiconductor substrate) 21 held inside the exposure mechanism unit 1a, and performs pattern exposure on a resist film (omitted in the drawing) formed on the wafer 21. That is, the exposure pattern formed on the pattern surface PS1 of the EUV mask MSK1 is transferred onto the wafer 21 (pattern transfer). The wafer 21 is held by a movably-provided wafer stage 6. With the movement of the wafer stage 6 and pattern transfer being repeatedly performed, the pattern is transferred onto a plurality of regions of the wafer 21.

The exposure optical system including the reflective illumination optical system 3, the EUV mask MSK1, and the reduced projection optical system 5 is surrounded by an optical system box (omitted in the drawing), and its inside is evacuated so as to have a particularly higher degree of vacuum compared to the surroundings. This is to protect the optical system from impurities and dust. Also, on the wafer side of the optical system box, an opening (omitted in the drawing) is formed.

The exposure optical system is configured of an off-telecentric optical system as described above in order to prevent the optical path of reflected light reflected from the reflecting mirror from being interrupted by the optical path of incident light incident to the reflecting mirror. For example, EUV light enters the front surface of the EUV mask MSK1 from a direction tilted by 5 degrees to 6 degrees with respect to a direction perpendicular to the pattern surface PS1 of the EUV mask MSK1. Also, EUV light as exposure light enters the wafer from a direction slightly tilted with respect to a direction perpendicular to the front surface of the wafer 21 held on the wafer stage 6. In this manner, even if every component of the exposure optical system is formed of an off-telecentric optical system, the optical path of the reflected light is not interrupted by the optical path of the incident light. Therefore, a region (a field) to be exposed can be widened.

The wafer stage 6 is provided, for example, so as to be movable in a direction perpendicular to an in-plane direction of the wafer 21, and is driven to move along the direction perpendicular to the front surface of the wafer 21 by a wafer stage driving unit not shown. In this manner, as will be described further below with reference to FIG. 12 and FIG. 13, the focal position can be changed along a film thickness direction of the resist film formed on the wafer 21. The focal position may be changed by moving, instead of the wafer stage 6, a portion other than the wafer stage 6 in the exposure mechanism unit 1a.

Also, for example, the wafer stage 6 is provided to be movable in each of two directions parallel to the in-plane direction of the wafer 21, and is driven to move along these two directions parallel to the in-plane direction of the wafer 21 by a wafer stage driving unit not shown. In this manner, as will be described further below with reference to FIG. 14 and FIG. 15, regions where respective chips are formed can be sequentially subjected to scan exposure.

<EUV Mask>

Figure 2:
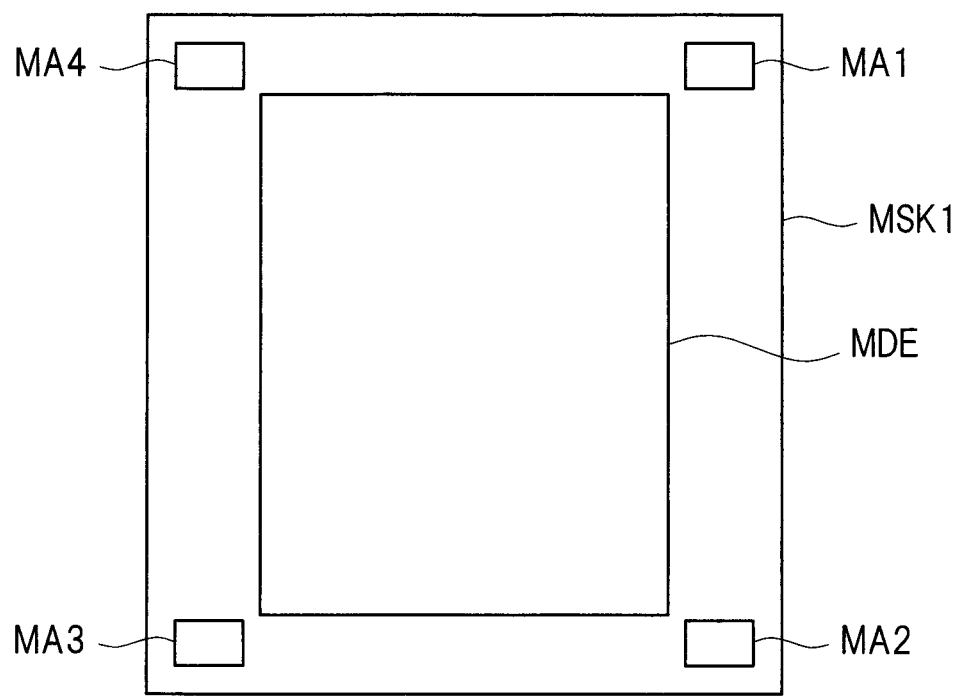
FIG. 2 is a plan view schematically illustrating a front surface of an EUV mask in the first embodiment.
Figure 3:
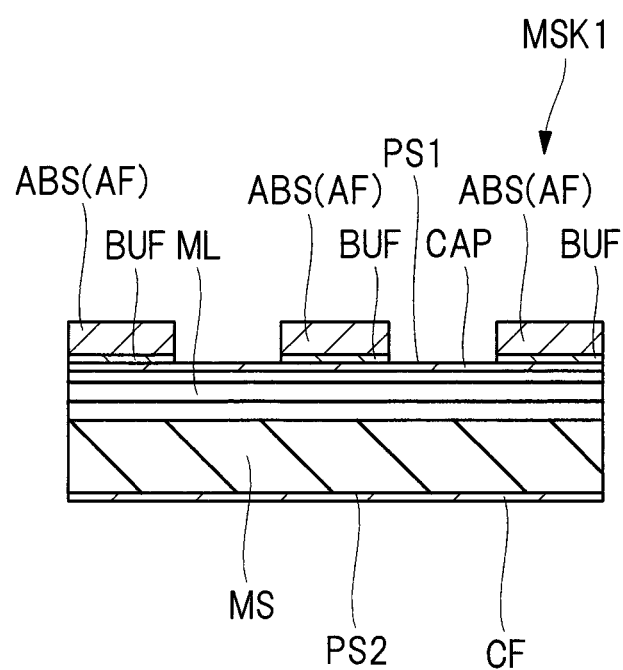
FIG. 3 is a cross-sectional view of main parts, illustrating a part of the EUV mask in the first embodiment.

Next, the general outline and structure of the EUV mask in the first embodiment is described with reference to FIG. 2 and FIG. 3. FIG. 2 is a plan view schematically illustrating the front surface of the EUV mask in the first embodiment. FIG. 3 is a cross-sectional view of main parts, illustrating a part of the EUV mask in the first embodiment.

As described above, a transmission-type mask allowing exposure light to pass therethrough cannot be used as an EUV mask in the wavelength region (for example, 13.5 nm) of EUV light. Therefore, as the EUV mask MSK1, as illustrated in FIG. 3, a reflective mask is used in which a multilayer reflective film (a reflective film) ML is formed on the pattern surface (the front surface or the first main surface) PS1 and an absorber pattern ABS is formed on the multilayer reflective film ML, the reflective mask reflecting EUV light as exposure light.

As illustrated in FIG. 2, the EUV mask MSK1 has a device pattern region MDE on a center part, where a circuit pattern of a semiconductor integrated circuit device is rendered. Also, in peripheral parts of the EUV mask MSK1, alignment mark regions MA1, MA2, MA3, and MA4 are placed including a mark for positioning the EUV mask, a wafer alignment mark, etc.

As illustrated in FIG. 3, the EUV mask MSK1 has the pattern surface PS1 and the back surface (the second main surface) PS2 opposite to the pattern surface PS1.

The EUV mask MSK1 has a mask base (a mask substrate) MS formed of a Low Thermal Expansion Material (LTEM) such as quartz glass or low thermal expansion glass. On the pattern surface PS1 of the EUV mask MSK1, the multilayer reflective film (the reflective film) ML is formed on the mask base MS. The multilayer reflective film ML has a structure in which, for example, molybdenum (Mo) and silicon (Si) are alternately laminated, and reflects EUV light as exposure light. As the multilayer reflective film ML, 40 pairs of multilayer films are normally used. Furthermore, 50 pairs or 60 pairs of multilayer films may be used. The state in which the multilayer reflective film ML is formed on the mask base MS is referred to as a multilayer-film mask blank. In the following, the multilayer-film mask blank may be simply referred to as a mask blank.

The EUV mask MSK1 has the absorber pattern ABS formed on the multilayer reflective film ML (that is, on the multilayer mask blank). In the absorber pattern ABS, an absorber film AF absorbing EUV light as exposure light is placed so as to have a desired pattern. Therefore, the exposure pattern formed on the pattern surface PS1 of the EUV mask MSK1 includes the multilayer reflective film ML formed on the pattern surface PS1, and the absorber pattern ABS formed on the multilayer reflective film ML. As a material of the absorber pattern ABS, a material with a low reflectance with respect to EUV light is used, such as tantalum (Ta), boron nitride tantalum nitride (TaBN), or tantalum nitride (TaN).

Also, in the EUV mask MSK1, a capping layer CAP is formed on the multilayer reflective film ML. As a material of the capping layer CAP, for example, Si, ruthenium (Ru), chromium (Cr) or the like is used.

On the capping layer CAP, the above-described absorber pattern ABS is formed via a buffer layer BUF. The buffer layer BUF is a protective film for preventing damage to the multilayer reflective film ML or preventing attachment of foreign substances (particles) to the multilayer reflective film ML when processing using a correction technique using a focused ion beam (FIB) is performed. However, as illustrated in FIG. 3, in a region of the pattern surface PS1 with the absorber pattern ABS removed therefrom, the buffer layer BUF is eventually removed after the processing with FIB. As a material of the buffer layer BUF, Cr, chromium nitride (CrN), or the like is used. Also, the buffer layer BUF may be omitted when a correction technique using an electron beam (EB) or the like is used in place of the correction technique using FIB.

The upper surface of the absorber pattern is subjected to oxidation processing (omitted in the drawing). In this manner, reflectivity with respect to defect inspection light having a wavelength, for example, near 250 nm or 193 nm, can be suppressed, and thus the defect inspection can be performed with high sensitivity.

On the other hand, a conductive film CF is formed on the rear surface PS2 of the EUV mask MSK1, that is, the rear surface PS2 of the mask base MS. As the electrostatic fastener 4a (refer to FIG. 1) of the mask stage (the holding unit) 4 (refer to FIG. 1) electrostatically absorbs the conductive film CF, the EUV mask MSK1 is held by the mask stage 4.

Figure 4:
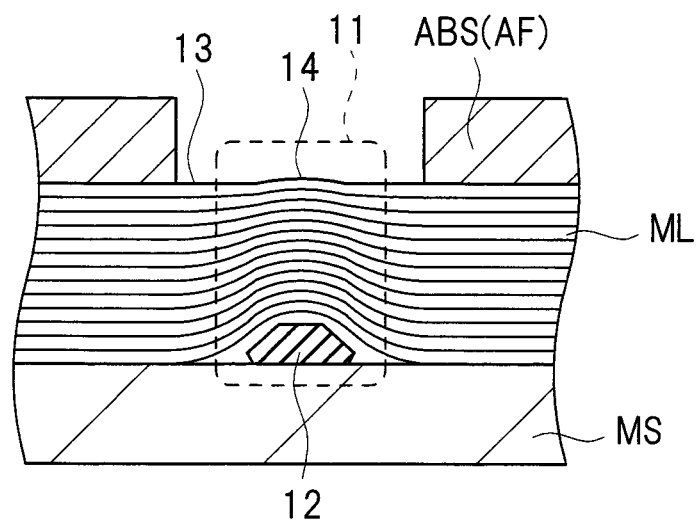
FIG. 4 is a cross-sectional view illustrating main parts of a part of a phase-defective EUV mask.
Figure 5:
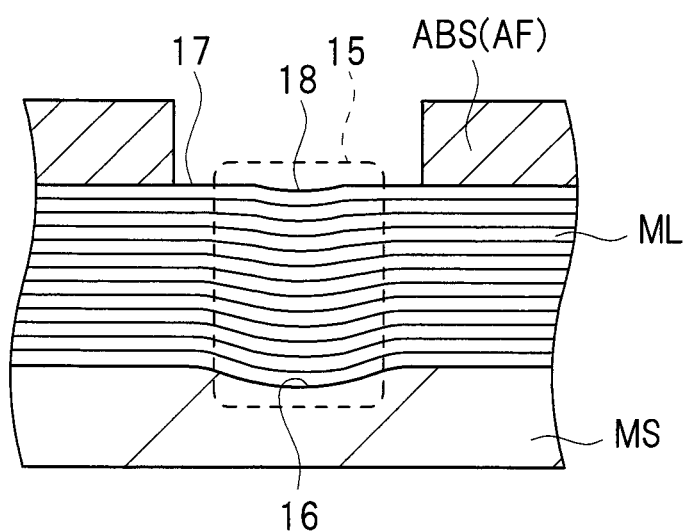
FIG. 5 is a cross-sectional view illustrating main parts of a part of a phase-defective EUV mask.

In the EUV mask, if a minute defect exists in the multilayer reflective film ML, this defect results in a phase defect. In the following, a typical phase defect is described with reference to FIG. 4 and FIG. 5. FIG. 4 and FIG. 5 are cross-sectional views each illustrating main parts of a part of a phase-defective EUV mask. In FIG. 4 and FIG. 5, for ease of understanding, the buffer layer BUF (refer to FIG. 3) and the capping layer CAP (refer to FIG. 3) are omitted from the drawings.

The EUV mask illustrated in FIG. 4 has a bump-shaped phase defect 11. This bump-shaped phase defect 11 occurs because, for example, a particle 12 as a foreign substance is inserted in the multilayer reflective film ML or between the multilayer reflective film ML and the mask base MS. Depending on the formation condition of the multilayer reflective film ML, by applying a film forming condition of a smoothing method or the like, an upper surface 13 of the multilayer reflective film ML is planarized. Therefore, a projection 14 formed above the particle 12 and on the upper surface 13 of the multilayer reflective film ML has a short height, for example, on the order of 1.5 nm. As such, although the height of the projection 14 formed on the upper surface 13 of the multilayer reflective film ML is short, disturbance of interference of EUV light occurs in the multilayer reflective film ML, resulting in a significant decrease of the reflectivity of the EUV light and an occurrence of a transfer defect in the pattern transferred onto the resist film formed on the main surface of the wafer 21.

The EUV mask illustrated in FIG. 5 has a pit-shaped phase defect 15. This pit-shaped defect 15 occurs because, for example, a pit defect 16 occurs to the front surface of the mask base MS when the mask base MS is polished to be planarized. As each layer of the multilayer reflective film ML laminated on the pit defect 16, unevenness on an upper surface 17 of the multilayer reflective film ML is mitigated. Therefore, since a recess 18 formed on the upper surface 17 of the multilayer reflective film ML has a shallow depth, it may be difficult to recognize the recess as a defect. However, disturbance of interference of EUV light occurs in the multilayer reflective film ML, resulting in a significant decrease of the reflectivity of the EUV light and an occurrence of a transfer defect in the pattern transferred onto the resist film formed on the main surface of the wafer 21.

<Exposing Process>

Figure 6:
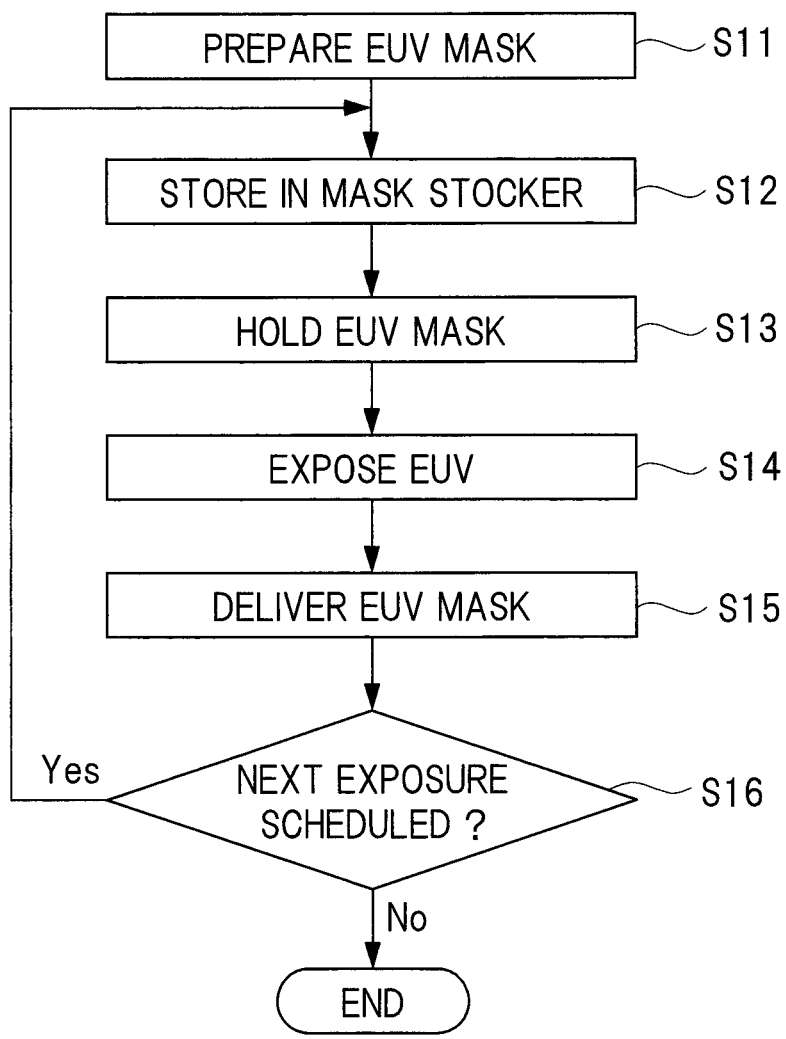
FIG. 6 is a flow diagram illustrating part of an exposing process of the first embodiment.

Next, an exposing process of exposing the wafer by using the above-described exposing apparatus 1 (refer to FIG. 1) is described with reference to FIG. 6. FIG. 6 is a flow diagram illustrating a part of the exposing process of the first embodiment.

First, the EUV mask MSK1 (refer to FIG. 3) for pattern exposure using EUV light as exposure light is prepared (step S11), and the prepared EUV mask MSK1 is moved to a mask stocker (omitted in the drawings) of the exposing apparatus 1 and stored therein (step S12).

Next, the EUV mask MSK1 (refer to FIG. 3) is held (mask holding process: step S13). In this mask holding process (step S13), the EUV mask MSK1 stored in the mask stocker (omitted in the drawings) is transferred by a mask transfer device (omitted in the drawings) to the exposure mechanism unit 1a (refer to FIG. 1) of the exposing apparatus 1 (refer to FIG. 1). Then, as illustrated in FIG. 1, the rear surface (the second main surface) PS2 of the delivered EUV mask MSK1 is electrostatically absorbed by the electrostatic fastener 4a. With this method, the EUV mask MSK1 is held by the mask stage (the holding unit) 4.

Next, EUV exposure is performed (EUV exposing process: step S14). In this EUV exposing process (step S14), as illustrated in FIG. 1, with the EUV mask MSK1 being held by the mask stage 4, the wafer 21 having a resist film formed thereon is held by the wafer stage 6 of the exposure mechanism unit 1a. Then, by using the EUV mask MSK1, the held wafer 21 is subjected to multifocal superposing exposure, which is a feature of the first embodiment, and pattern exposure as scan exposure. After the wafer 21 subjected to pattern exposure is delivered from the wafer stage 6, the next wafer 21 is held by the wafer stage 6, and then pattern exposure is performed on the next held wafer 21. In this manner, a plurality of predetermined wafers 21 are successively subjected to pattern exposure.

Details of the EUV exposing process will be described further below with reference to FIG. 7 to FIG. 11.

After pattern exposure is successively performed on the plurality of predetermined wafers 21, the EUV mask MSK1 is carried out (mask carrying out process: step S15). In this mask carrying out process (step S15), electrostatic absorption of the EUV mask MSK1 by the electrostatic fastener 4a of the mask stage 4 is stopped, and the EUV mask MSK1 after stopping electrostatic absorption is removed from the mask stage 4 and carried out.

Next, it is determined whether next exposure is scheduled (exposure schedule determining process: step S16). When next exposure is scheduled, the EUV mask MSK1 is moved to the mask stocker (omitted in the drawings) of the exposing apparatus 1 (refer to FIG. 1) and stored therein (step S12). On the other hand, when no next exposure is scheduled, the process ends.

After the mask delivering process (step S15) and before the exposure schedule determining process (step S16), a process of cleaning the rear surface PS2 of the EUV mask MSK1 (mask rear-surface cleaning process) can be performed. Also, after the mask carrying out process (step S15) and before the exposure schedule determining process (step S16), a process of making a foreign substance inspection on the pattern surface PS1 of the EUV mask MSK1 (foreign-substance inspection process) can be performed.

<Semiconductor Device Manufacturing Process>

Next, the semiconductor device manufacturing process including the exposing process described above is described with reference to FIG. 7 to FIG. 11. FIG. 7 to FIG. 11 are cross-sectional views of main parts of the semiconductor device during a manufacturing process of the first embodiment.

Figure 8:
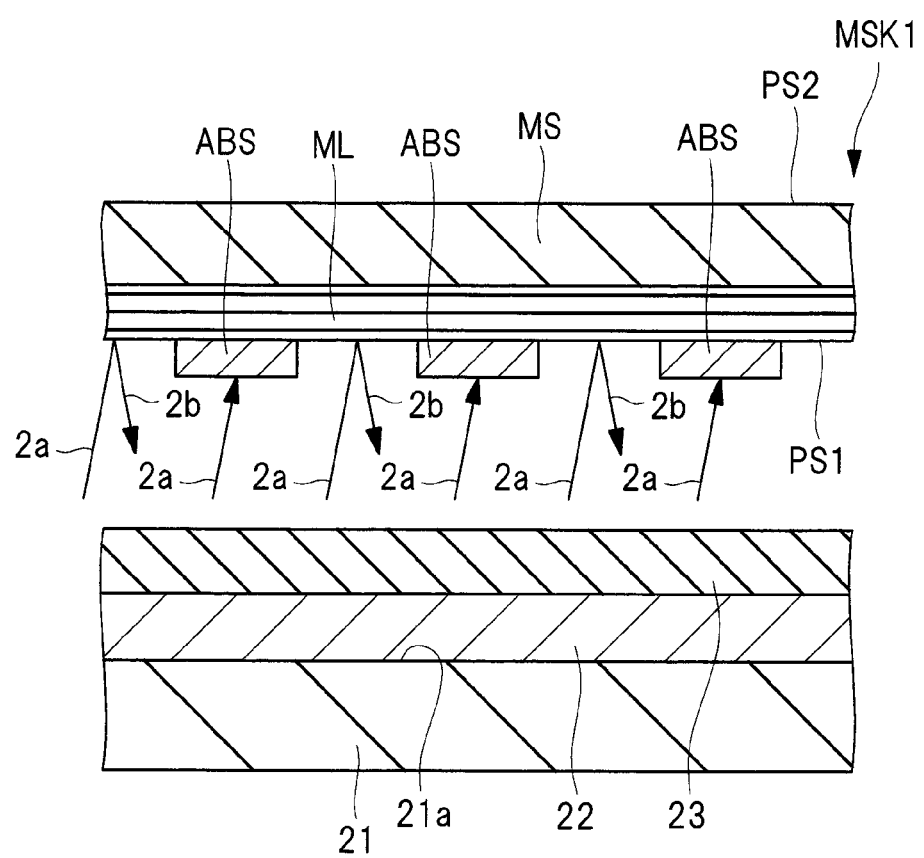
FIG. 8 is a cross-sectional view of main parts of the semiconductor device during the manufacturing process of the first embodiment.

In FIG. 8, for facilitating understanding, the capping layer CAP (refer to FIG. 3), the buffer layer BUF (refer to FIG. 3), and the conductive film CF (refer to FIG. 3) of the EUV mask MSK1 are omitted from the drawings.

In the following, an example is described in which a workpiece film (a film to be processed or etched) is formed on the main surface of the wafer and the workpiece film is processed (etched) into a desired pattern.

Figure 7:
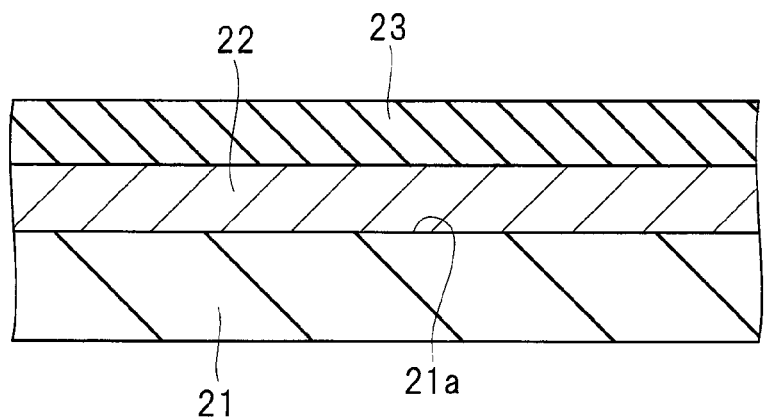
FIG. 7 is a cross-sectional view of main parts of a semiconductor device during a manufacturing process of the first embodiment.

First, a resist film is formed on the workpiece film formed on a main surface of the wafer (resist film forming process). In this resist film forming process, first, as illustrated in FIG. 7, the wafer 21 having the workpiece film 22 formed on a main surface 21a of the wafer 21 is prepared. Then, a resist (a photoresist) is applied onto the workpiece film 22, and the workpiece film 22 is subjected to a heat treatment, thereby forming a resist film (a photoresist film) 23. As illustrated in FIG. 7, in EUV lithography, it is not required to form a reflection preventive film or the like between the resist film 23 and the workpiece film 22. However, an adhesion reinforcing film (omitted in the drawings) for reinforcing adhesion force between the resist film 23 and the workpiece film 22 to prevent the resist pattern from falling can be formed between the resist film 23 and the workpiece film 22. Alternatively, a hard mask (omitted in the drawings) for compensating for a shortage of etching resistance of the resist film 23 can be formed between the resist film 23 and the workpiece film 22.

Next, the wafer having the resist film formed on the main surface of the wafer is held by the wafer stage (mask holding process).

Next, the resist film is exposed by using EUV light as exposure light (EUV exposing process). This EUV exposing process can be performed in the same manner as the EUV exposing process described with reference to FIG. 6 (step S14 of FIG. 6).

Specifically, as illustrated in FIG. 8, the EUV mask MSK1 having an exposure pattern including the multilayer reflective film ML and the absorber pattern ABS formed on the pattern surface PS1 is irradiated with the exposure light 2a. The exposure light 2a applied to the multilayer reflective film ML is reflected from the multilayer reflective film ML to become the reflected light 2b. On the other hand, the exposure light 2a applied to the absorber pattern ABS is absorbed into the absorber pattern ABS and is therefore not reflected. As a result, the reflected light 2b reflected from the multilayer reflective film ML on the pattern surface PS1 is applied to the resist film 23 via the reduced projection optical system 5 (refer to FIG. 1). In this manner, the resist film 23 is subjected to pattern exposure using the exposure pattern including the multilayer reflective film ML and the absorber pattern ABS.

Figure 9:
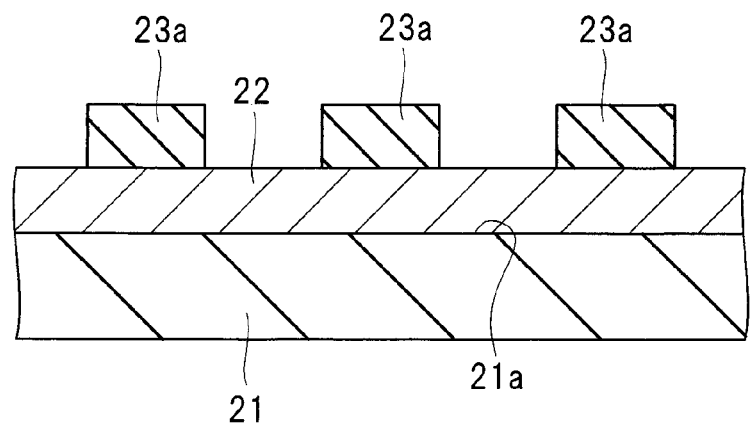
FIG. 9 is a cross-sectional view of main parts of the semiconductor device during the manufacturing process of the first embodiment.

Next, the resist film subjected to pattern exposure is developed (developing process). In this developing process, the resist film 23 (refer to FIG. 8) subjected to pattern exposure is developed. In this manner, as illustrated in FIG. 9, a resist pattern 23a having the exposure pattern including the absorber pattern ABS (refer to FIG. 8) of the EUV mask MSK1 (refer to FIG. 8) transferred thereto is formed.

Figure 10:
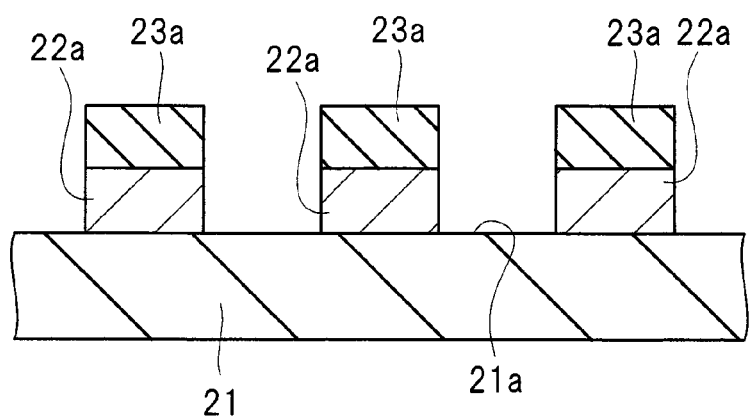
FIG. 10 is a cross-sectional view of main parts of the semiconductor device during the manufacturing process of the first embodiment.
Figure 11:
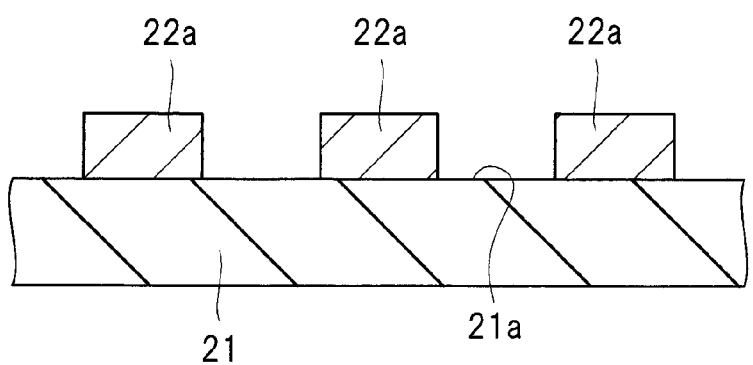
FIG. 11 is a cross-sectional view of main parts of the semiconductor device during the manufacturing process of the first embodiment.

Next, the workpiece film is etched (etching process). In this etching process, the resist pattern 23a is used as an etching mask to process (etch) the workpiece film 22 (refer to FIG. 9). In this manner, as illustrated in FIG. 10, a pattern 22a is formed on the wafer 21, the pattern 22a being formed of the workpiece film 22 (refer to FIG. 9) and having the exposure pattern including the absorber pattern ABS (refer to FIG. 8) of the EUV mask MSK1 (refer to FIG. 8) transferred thereon. Then, as illustrated in FIG. 11, the resist pattern 23a is removed by, for example, ashing.

<EUV Exposing Process>

Next, the EUV exposing process included in the exposing process is described with reference to FIG. 12 to FIG. 16.

In the EUV exposing process of the first embodiment, while the focal position (focus position or best focus position) of reflected light applied to the resist film is being changed along the film thickness direction of the resist film, a process of irradiating the resist film with the reflected light is repeated a plurality of times, thereby performing pattern exposure of the resist film.

Also, in the EUV exposing process of the first embodiment, suitably, in each process of irradiating the resist film with the reflected light, which is repeatedly performed a plurality of times, the resist film is irradiated with the reflected light, while the focal position of the reflected light applied to the resist film being fixed. Then, every time the process is performed, the focal position of the reflected light is changed. That is, in the EUV exposing process of the first embodiment, multifocal superposing exposure is performed in which exposure is repeated a plurality of times with different focal positions of the reflected light in the respective exposures.

Figure 12:
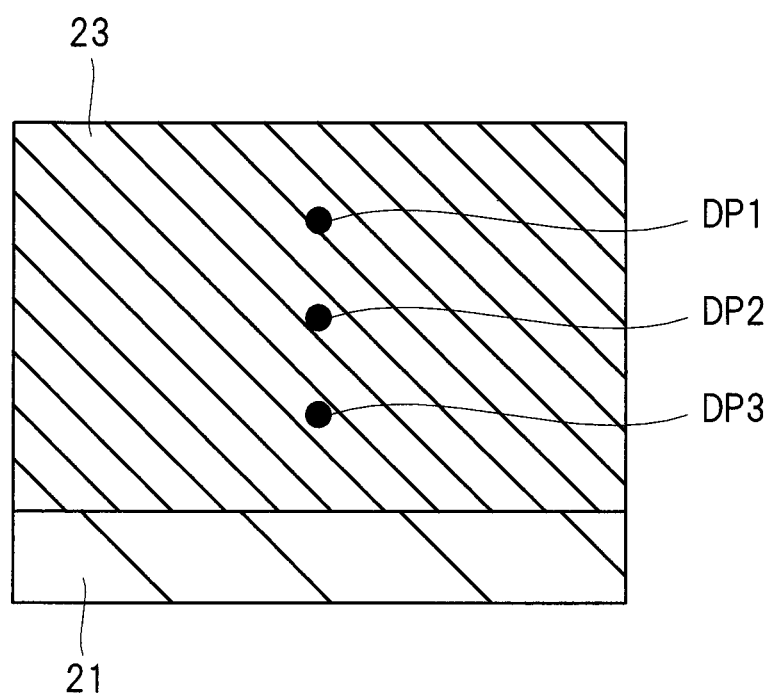
FIG. 12 is a cross-sectional view for describing the concept of multifocal superposing exposure.
Figure 13:
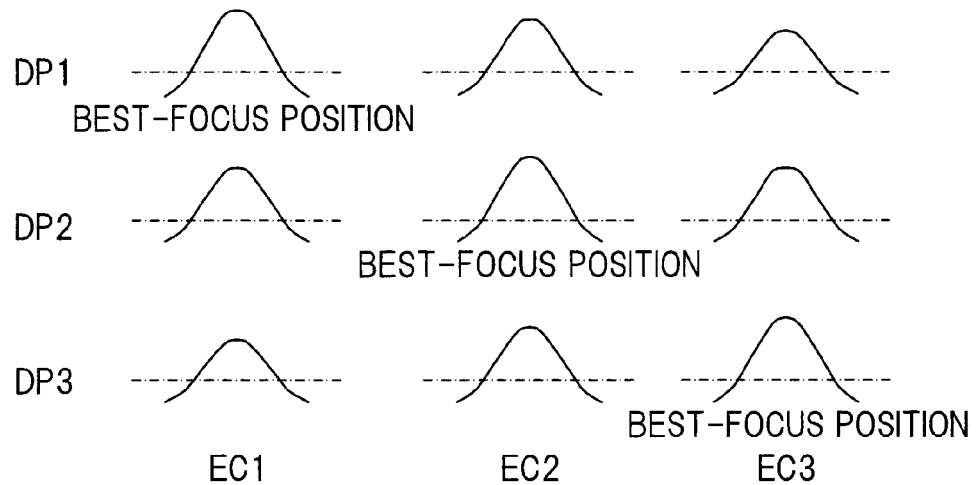
FIG. 13 is a graph schematically representing a distribution of light amounts of reflected light along an in-plane direction at each depth position when a focal position is changed.

FIG. 12 is a cross-sectional view for describing the concept of multifocal superposing exposure. FIG. 13 is a graph schematically representing a distribution of light amounts of reflected light along an in-plane direction at each depth position when a focal position is changed.

As described above, multifocal superposing exposure is performed such that, while the focal position is being changed along the film thickness direction of the resist film formed on the wafer, the process of irradiating the resist film with the reflected light is repeated a plurality of times. For example, as illustrated in FIG. 12, it is assumed that the focal position is changed among three points, that is, different depth positions DP1, DP2, and DP3. Furthermore, for example, it is assumed that exposure conditions EC1, EC2, and EC3 are set where the focal position is set at the depth positions DP1, DP2, and DP3, respectively. Here, FIG. 13 depicts distributions of light amounts of reflected light with exposure conditions EC1, EC2, and EC3, in the order from left toward right on the paper. Also, for each of the exposure conditions EC1, EC2, and EC3, three graphs depicted along a column from above toward below on the paper schematically represent distributions of light amounts of reflected light along an in-plane direction at the respective depth positions DP1, DP2, and DP3.

In FIG. 12, an example is illustrated in which the focal position is changed among three different depth positions. However, the number of depth positions for changing the focal position is not restricted to three. The focal position may be changed among two or four or more different depth positions. Note that if the number of times of repetitive exposure by changing the focal position increases, the number of processes increases. Therefore, the number of depth positions for changing the focal position is preferably two or three. Also, if the focal position is changed also in the in-plane direction, the shape of the pattern for pattern exposure (the pattern shape) may be distorted. Therefore, the focal position is preferably changed only along the film thickness direction of the resist film.

Here, the focal position (the focus position or the best focus position) means a depth position (a height position) at which the sharpest pattern shape can be obtained. Also, when the pattern shape is a dot (a dot pattern), specifically, when the pattern shape is a hole (a hole pattern), as illustrated in FIG. 13, the focal position is a depth position (a height position) at which a distribution of light amounts with the highest peak intensity can be obtained.

In the first embodiment, multifocal superposing exposure is performed, including exposure with the exposure condition EC1 taking the depth position DP1 as a focal position, exposure with the exposure condition EC2 with the depth position DP2 as a focal position, and exposure with the exposure condition EC3 with the depth position DP3 as a focal position. Here, at the depth position DP1, pattern exposure is performed with a pattern shape obtained by combining the pattern shape by exposure with the exposure condition EC1, the pattern shape by exposure with the exposure condition EC2, and the pattern shape by exposure with the exposure condition EC3.

In this multifocal superposing exposure, it is desirable to pay attention to a shift along the in-plane direction of the pattern shape by off-telecentric exposure. Here, with reference to FIG. 14 to FIG. 16, a method of decreasing the shift along the in-plane direction of the pattern shape by off-telecentric exposure is described.

Figure 14:
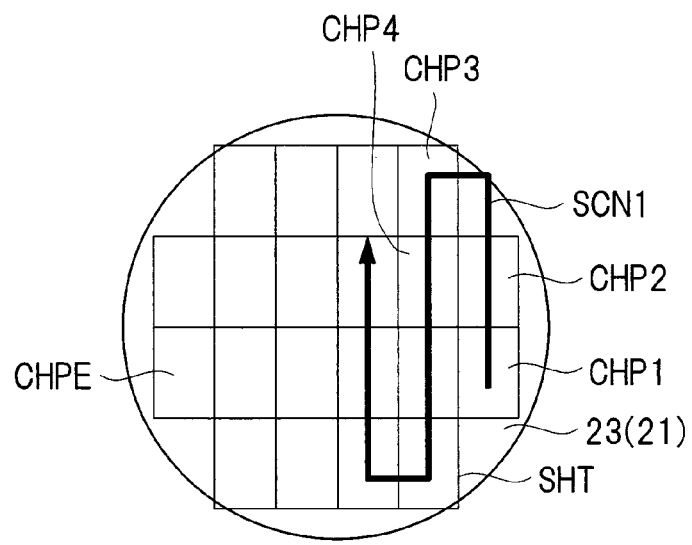
FIG. 14 is a diagram for describing a procedure of scan exposure.
Figure 15:
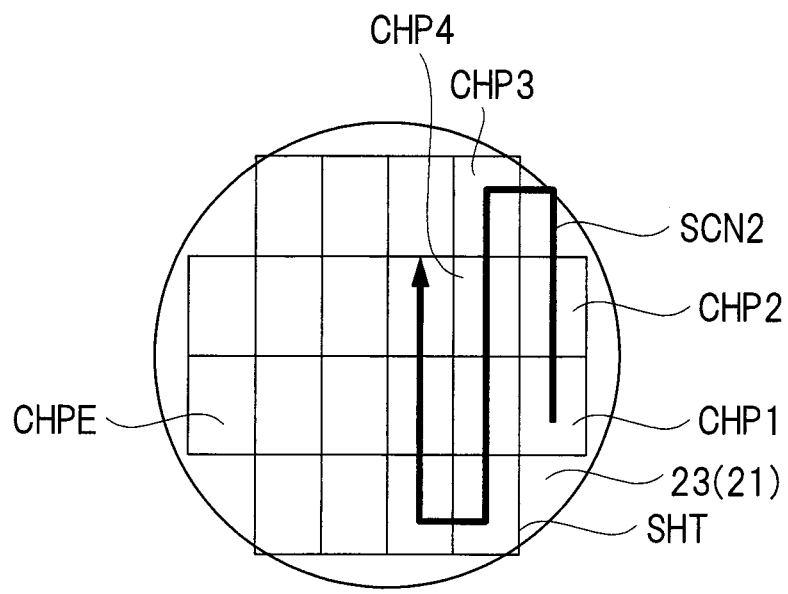
FIG. 15 is a diagram for describing the procedure of scan exposure.
Figure 16:
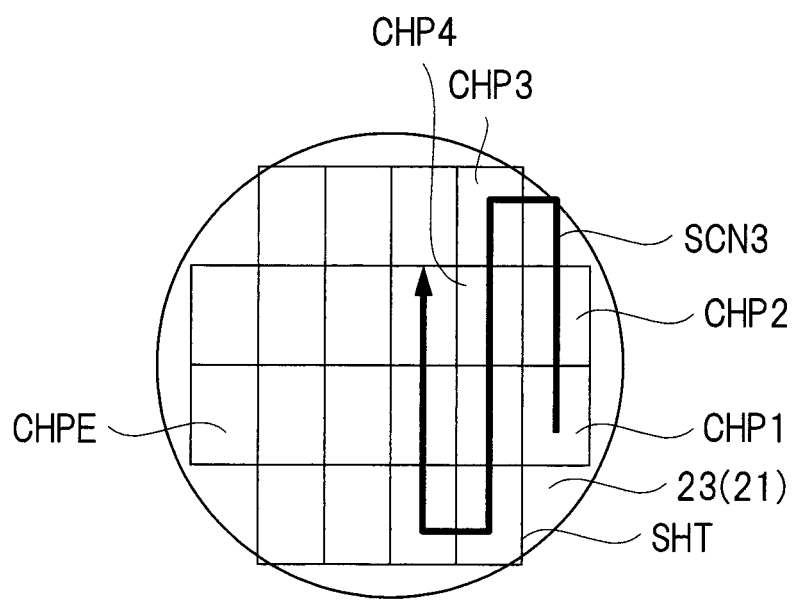
FIG. 16 is a diagram for describing the procedure of scan exposure.

FIG. 14 to FIG. 16 are diagrams for describing a procedure of scan exposure. FIG. 14 to FIG. 16 are plan views of the wafer 21, illustrating the order of scan exposure of a region of the wafer 21 where a plurality of chips are to be formed. Also, among FIG. 14 to FIG. 16, SHT represents a layout diagram of an exposure region.

First, a first scan exposure is performed. In the first scan exposure, a scan exposure SCN1 with the depth position DP1 being set as a focal position. In this first scan exposure SCN1, as illustrated in FIG. 14, the resist film 23 is first irradiated with reflected light for exposure in a region CHP1 where a first chip is to be formed and then in a region CHP2 where a second chip is to be formed. Similarly and sequentially, exposure in a region CHP3 where a third chip is to be formed and exposure in a region CHP4 where a fourth chip is to be formed, and so on are performed, and then exposure in a region CHPE where the last chip is to be formed is performed. That is, the process of irradiating the resist film 23 with reflected light in a partial region of the main surface of the wafer 21 is repeated a plurality of times. Here, while regions of the main surface of the wafer 21 to be irradiated with reflected light are being scanned, the process of irradiating the resist film 23 with reflected light in a partial region is repeated a plurality of times.

Next, a second scan exposure is performed without removing the EUV mask MSK1 from the mask stage 4 and without removing the wafer 21 from the wafer stage 6. In the second scan exposure, the focal position is changed, and the depth position DP2 is set as a new focal position for a scan exposure SCN2. In this second exposure SCN2, as illustrated in FIG. 15, the order of exposing the regions where the respective chips are to be formed is assumed to be the same as the order in the first scan exposure SCN1 in order to avoid an influence such as backlash. That is, starting with the region CHP1 where the first chip is to be formed, exposure is performed on each region, from the region CHP2 where the second chip is to be formed, the region CHP3 where the third chip is to be formed, the region CHP4 where the fourth chip is to be formed, and onward until the region CHPE where the last chip is to be formed.

In EUV lithography, since the optical system is an off-telecentric optical system, the exposure magnification changes with the change of the focal position. Therefore, in the second scan exposure SCN2, the focal position is changed before scan exposure starts, and also the exposure magnification is corrected so that the exposure magnification in the second scan exposure SCN2 is equal to the exposure magnification in the first scan exposure SCN1. That is, while the focal position of reflected light is changed and also the exposure magnification is corrected so as not to change before and after the change of the focal position, the process of irradiating the resist film 23 with reflected light is repeatedly performed.

Next, a third scan exposure is performed without removing the EUV mask MSK1 from the mask stage 4 and without removing the wafer 21 from the wafer stage 6. In the third scan exposure, the focal position is changed, and the depth position DP3 is set as a new focal position for a scan exposure SCN3. Also in this third scan exposure SCN3, as illustrated in FIG. 16, the order of exposing the regions where the respective chips are to be formed is assumed to be the same as the order in the first scan exposure SCN1 in order to avoid an influence such as backlash. That is, starting with the region CHP1 where the first chip is to be formed, exposure is performed for each region, from the region CHP2 where the second chip is to be formed, the region CHP3 where the third chip is to be formed, the region CHP4 where the fourth chip is to be formed, and onward until the region CHPE where the last chip is to be formed.

Also in the third scan exposure SCN3, the focal position is changed before scan exposure starts, and also the exposure magnification is corrected so that the exposure magnification in the third scan exposure SCN3 is equal to the exposure magnification in the first scan exposure SCN1. That is, while the focal position of reflected light is changed and also the exposure magnification is corrected so as not to change before and after the change of the focal position, the process of irradiating the resist film 23 with reflected light is repeatedly performed.

In the first embodiment, after any scan exposure, the next scan exposure is performed without removing the EUV mask MSK1 from the mask stage 4 and without removing the wafer 21 from the wafer stage 6. Also in the first embodiment, the order of exposing the regions where the respective chips are to be formed in the second scan exposure onward is assumed to be the same as the order of exposing the regions where the respective chips are to be formed in the first scan exposure SCN1 in order to avoid an influence such as backlash. For this reason, a shift in the pattern shape among exposures in multifocal superposing exposure is suppressed lower than or equal to a transfer accuracy level of the wafer stage 6, thereby ensuring sufficient accuracy.

When the influence such as backlash is small, the order of exposing the regions where the respective chips are to be formed in the second scan exposure SCN2 can be reversed to the order of exposing the regions where the respective chips are to be formed in the first scan exposure SCN1. In this manner, it is not required to move the wafer stage 6 from the region CHPE where the last chip is to be formed to the region where the first chip CHP1 is to be formed between scan exposures. Therefore, the time required for scan exposure can be reduced.

Also in the first embodiment, exposure is performed with the exposure magnification corrected so that the exposure magnification in the second scan exposure onward is equal to the exposure magnification in the first scan exposure. For this reason, even if the optical system is an off-telecentric optical system, it is possible to prevent or suppress the change of the exposure magnification with the change of the focal position and the occurrence of a shift of the pattern shape between exposures in multifocal superposing exposure.

In the first embodiment, when the exposure magnification is corrected together with the change of the focal position, the exposure magnification can be corrected by moving the mask stage 4 and the wafer stage 6 or by subtly moving part of mirrors of the projection optical system. In this manner, aberration occurring due to the correction of the exposure magnification can also be corrected.

Furthermore, in the first embodiment, as described above, with the focal position being fixed, the first scan exposure is performed by irradiating the resist film with reflected light. Then, the scan exposure is repeated a plurality of times while the focal position is changed for each scan exposure. That is, the focal position is discretely changed for each of the repeatedly-performed scan exposures. Here, by changing the focal position and also correcting the exposure magnification, the exposure magnification changes with the change of the focal position, thereby preventing or suppressing the occurrence of a shift of the pattern shape between exposures in multifocal superposing exposure. Therefore, the influence because of using the off-telecentric system as an optical system can be eliminated or reduced by a simple method.

At each exposure in multifocal superposing exposure, the focal position can be successively changed.

<Regarding Range of Changing Focal Position>

In the multifocal superposing exposure described above, the range of changing the focal position is preferably optimized. Here, the range of changing the focal position suitable for increasing shape accuracy of the pattern shape in multifocal superposing exposure is described.

As described with reference to FIG. 12 and FIG. 13, when three different depth positions DP1, DP2, and DP3 are set as focal positions and multifocal superposing exposure is performed three times, the intermediate depth position DP2 among the depth positions DP1, DP2, and DP3 is set as a focal position for normal exposure. In this case, one of the depth positions DP1 and DP3 has less influences of the phase defect on the pattern dimension than those of the depth position DP2, but the other has more influences of the phase defect on the pattern dimension than those of the depth position DP2. Therefore, when the exposing process using the EUV mask with a phase defect is performed, the shape accuracy of the pattern shape in multifocal superposing exposure may be lower than or substantially equal to the shape accuracy of the pattern shape in normal exposure.

In particular, when the range of changing the focal position is large, the influence of the phase defect on the pattern dimension is large. Therefore, the influence of the phase defect cannot be reduced with multifocal superposing exposure. Also, when the range of changing the focal position is too large, the contrast of an optical image by the reflected light decreases, and the resolution of the pattern transferred to the resist film formed on the main surface of the wafer 21 may decrease.

On the other hand, when the range of changing the focal position is small, the influence of the phase defect on the pattern dimension is small, and the influence on a CD (Critical Dimension), which is the pattern dimension of the pattern transferred to the resist film, is small. The reason for this can be considered such that, for example, the influence of blunt contrast of the optical image by the reflected light and the influence of a behavior of the electromagnetic field near the phase defect synergize with each other.

Figure 17:
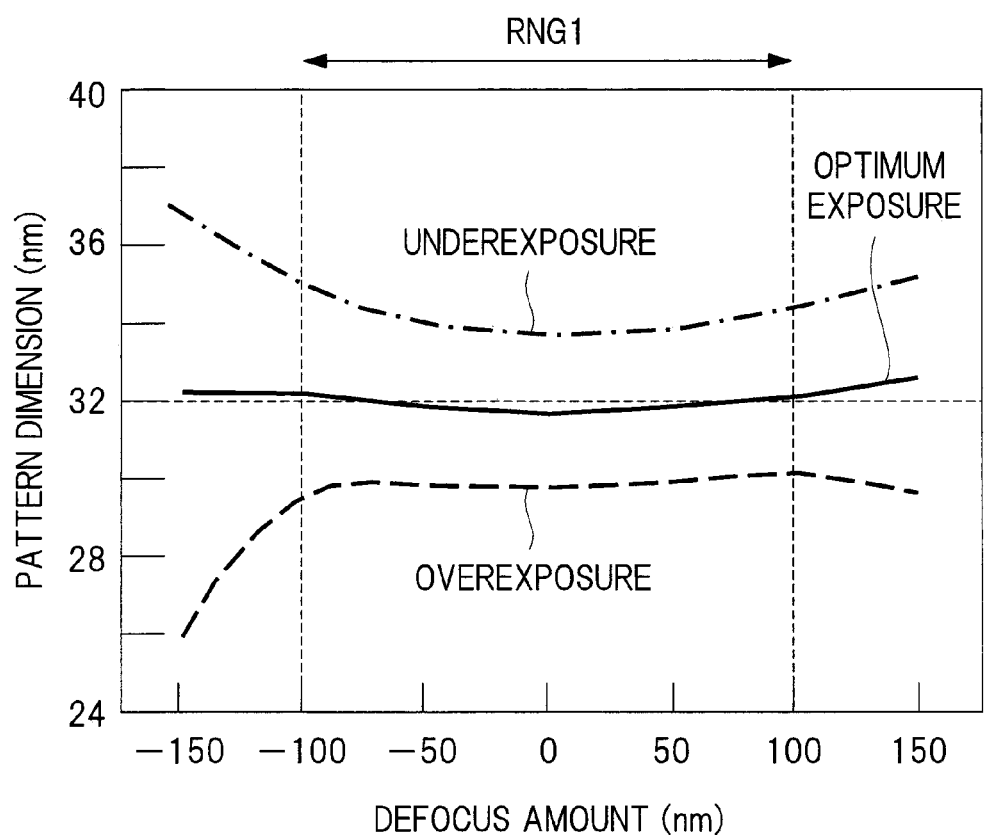
FIG. 17 is a graph illustrating defocus amount dependency of a pattern dimension of a resist pattern formed by using an EUV mask without a phase defect.

FIG. 17 is a graph illustrating defocus amount dependency of a pattern dimension of a resist pattern formed by using an EUV mask without a phase defect. The defocus amount is an amount of change of the focal position along the film thickness direction of the resist film when the focal position (focus position or best focus position) for normal exposure is taken as a reference position.

FIG. 17 depicts defocus amount dependency of the pattern dimension, that is, CD, of the formed resist pattern when a pattern (a line-and-space pattern) having a line width of 32 nm and a space width of 32 nm is transferred to the resist film by using a mask without a phase defect. FIG. 17 depicts the case where the exposure pattern is transferred to the resist film by a scan-type exposing apparatus having a numerical aperture NA of 0.25 in the projection optical system. FIG. 17 also depicts characteristic curves indicating changes of the pattern dimension when the exposure amount is appropriate (optimum exposure), when the exposure amount is more than appropriate (overexposure), and when the exposure amount is less than appropriate (underexposure).

According to the characteristic curves for optimum exposure in FIG. 17, a uniform CD is obtained in a defocus amount range of ±150 nm. This is because EUV light having a short waveform of 13.5 nm is used as exposure light in EUV exposure and therefore the depth of focus is deep.

Figure 18:
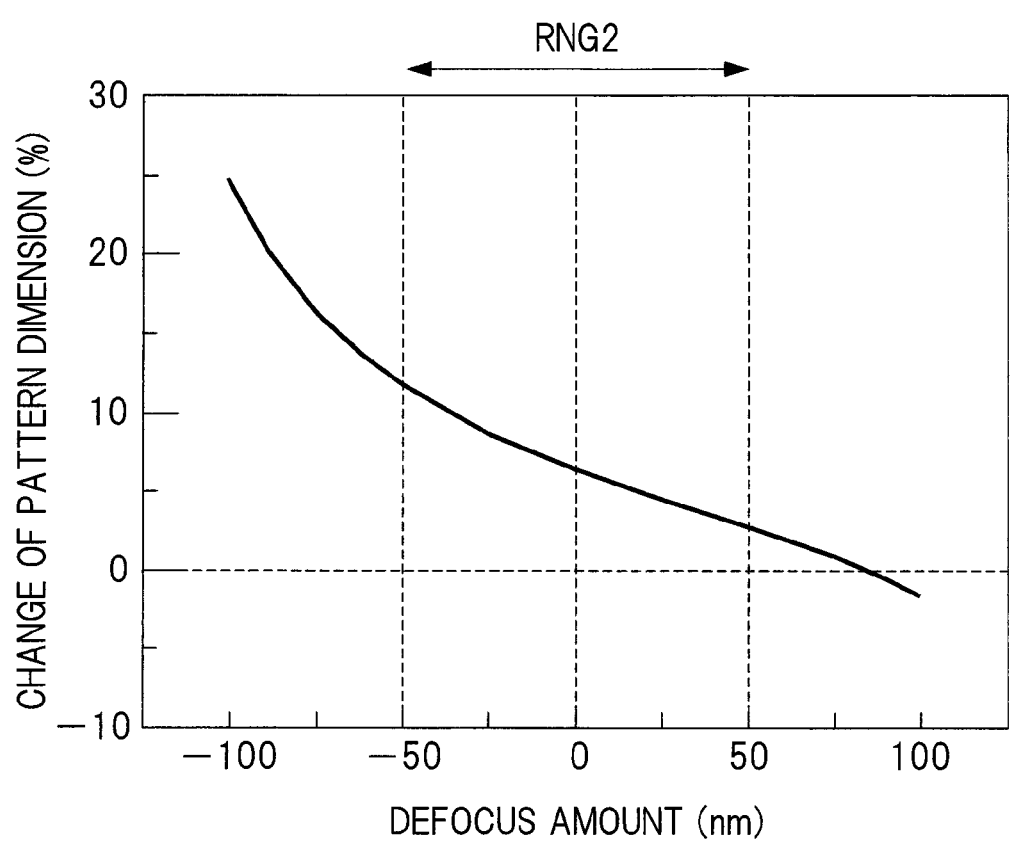
FIG. 18 is a graph illustrating defocus amount dependency of a pattern dimension of a resist pattern formed by using a phase-defective EUV mask.

FIG. 18 is a graph illustrating defocus amount dependency of the pattern dimension of a resist pattern formed by using a phase-defective EUV mask. The vertical axis of FIG. 18 represents pattern dimensional change when the pattern dimension with an EUV mask not having a phase defect is taken as a reference value.

FIG. 18 depicts defocus amount dependency of the pattern dimension, that is, CD, of the formed resist pattern when the bump-shaped phase defect illustrated in FIG. 4 is formed at the center between lines of a pattern (a line-and-space pattern) having a line width of 32 nm and a space width of 32 nm. FIG. 18 depicts the case where the exposure pattern is transferred to the resist film by a scan-type exposing apparatus having a numerical aperture NA of 0.25 in the projection optical system.

When the EUV mask has a bump-shaped phase defect, the CD change amount is particularly large in a negative area of the defocus amount, that is, in an area where the wafer approaches the projection optical system. As a result, a curve representing a CD change has an asymmetric shape between a left area on paper where the defocus amount is in a negative area and a right area on paper where defocus amount is in a positive area, centering on a position of 0 of the defocus amount.

Although omitted in the drawings, when the EUV mask has a pit-shaped defect, the CD change amount is particularly large in a positive area of the defocus amount, that is, in an area where the wafer goes away from the projection optical system. As a result, a curve representing a CD change has an asymmetric shape between a left area on paper where the defocus amount is negative and a right area on paper where defocus amount is positive, centering on a position of 0 of the defocus amount.

In the first embodiment, multifocal superposing exposure can be performed three times with the depth positions DP1, DP2, and DP3 being set at, for example, −40 nm, 0 nm, and +40 nm, respectively, and with each of the depth positions DP1, DP2, and DP3 being set as a focal position. In this manner, even if the EUV mask has a bump-shaped phase defect and even if the EUV mask has a pit-shaped phase defect, the shape accuracy of the pattern shape in multifocal superposing exposure can be made higher than the shape accuracy of the pattern shape in normal exposure.

Also, in the first embodiment, when multifocal superposing exposure is performed, suitably, the focal position of the reflected light can be changed in a range more than or equal to a half of the depth of focus. In this manner, the shape accuracy of the pattern shape in multifocal superposing exposure can be reliably made higher than the shape accuracy of the pattern shape in normal exposure.

The reason for this can be thought such that this relates to the fact that a range of the defocus amount of −50 nm to 50 nm where the CD substantially linearly changes in FIG. 18 is substantially half of a range RNG1 of the defocus amount of −100 nm to 100 nm where the pattern dimension is substantially constant in the characteristic curve in the case of overexposure of FIG. 17. That is, the range of the defocus amount of −100 nm to 100 nm where the pattern dimension is substantially constant in the characteristic curve in the case of overexposure of FIG. 17 corresponds to the depth of focus. Also as illustrated in FIG. 18, when the change range of the focus position is smaller than or equal to a range RNG2 of −50 nm to 50 nm, the CD substantially linearly changes, and the CD change decreases. Therefore, it can be thought that when the focal position is changed in a range smaller than or equal to a half of the depth of focus, the shape accuracy of the pattern shape in multifocal superposing exposure can be made higher than the shape accuracy of the pattern shape in normal exposure.

Changing the focal position in a range smaller than or equal to half of the depth of focus means that the range in which the focal position is changed is in a range smaller than or equal to half of the depth of focus. That is, this means that the distance between a maximum position and a minimum position among the depth positions that can be set as a focal position is smaller than or equal to half of the depth of focus.

When the wavelength of exposure light is taken as $\lambda$, the depth of focus is represented normally by $\pm\lambda/\{2(NA)^2\}$. However, the depth of focus changes with the pattern dimension, that is, CD, of the pattern transferred to the resist film even if the exposure condition is the same. For this reason, a determination is preferably made based on defocus amount dependency of the pattern dimension of a pattern with the most restricted exposure condition, that is, a pattern with the smallest CD.

<EUV Mask Fabricated by Mask Bias>

Next, an EUV mask fabricated by mask bias of decreasing the line width of the absorber pattern of the EUV mask from a value (a pivotal value) designed as an optimum value when no phase defect is present. In the first embodiment, when multifocal superposing exposure is performed by using the EUV mask fabricated by mask bias as described below, the influence of the phase defect can be further decreased compared to the case of multifocal superposing exposure using a normal EUV mask.

Figure 19:
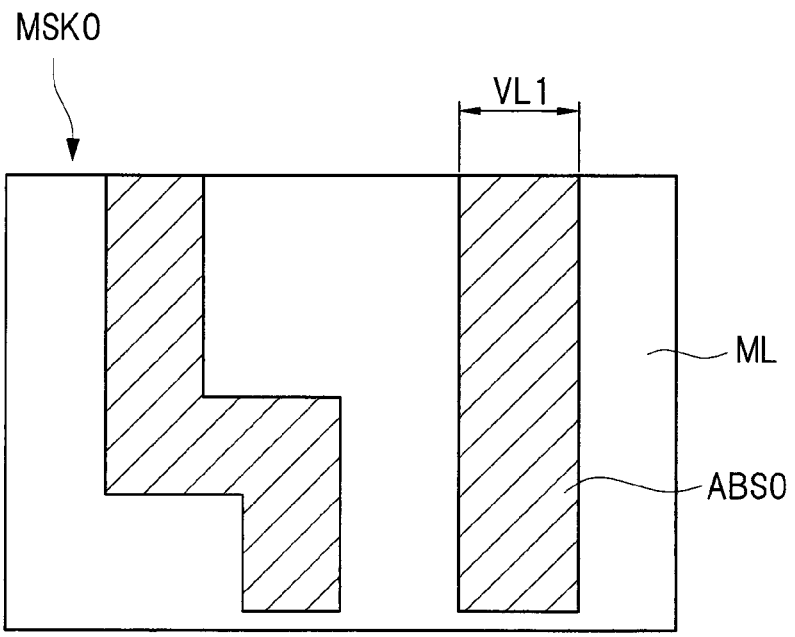
FIG. 19 is a diagram for describing an EUV mask fabricated by mask bias.
Figure 20:
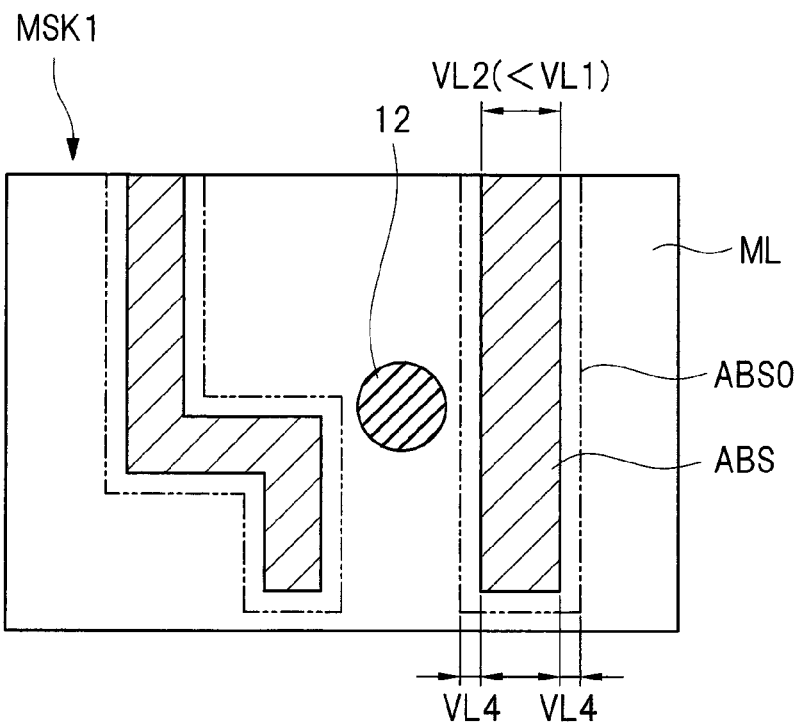
FIG. 20 is a diagram for describing the EUV mask fabricated by mask bias.

FIG. 19 and FIG. 20 are diagrams for describing an EUV mask fabricated by mask bias. FIG. 19 is a plan view of an EUV mask fabricated without mask bias. FIG. 20 is a plan view of an EUV mask fabricated by mask bias.

Normally, the absorber pattern of the EUV mask has been additionally subjected to processing such as OPC (Optical Proximity Correction), FVC (Flare Variation Compensation), PPC (Pattern Proximity Correction) by etching or the like.

In the first embodiment, the EUV mask to be used is the one subjected to, in addition to the normal process described above, a pattern sizing treatment in which the line width of the absorber pattern is further decreased and the opening width of the absorber pattern is increased. A process of manufacturing an EUV mask including this pattern sizing process can be performed as follows, for example.

First, as illustrated in FIG. 19, an EUV mask MSK0 having an exposure pattern including the multilayer reflective film ML formed on the front surface of the mask substrate MS to reflect exposure light and the absorber pattern ABS formed on the multilayer reflective film ML to absorb the exposure light and not having a phase defect is prepared. Here, the line width of the absorber pattern ABS0 is assumed to be VL1. Then, the prepared EUV mask MSK0 is held by the mask stage 4 (refer to FIG. 1)

The case without a phase defect means the case without a phase defect at all or the case with a phase defect but without a phase defect having, for example, a bump height exceeding an allowable bump height, which will be described further below, in width dimension set in advance.

Also, with a process similar to the process described with reference to FIG. 7, the resist film 23 is formed on the film 22 to be etched, the film formed on the main surface of the wafer (substrate) 21 (second resist film forming process). Then, the wafer 21 having the resist film 23 formed on the main surface of the wafer 21 is held by the wafer stage 6 (refer to FIG. 1) (second mask holding process). However, in the EUV mask manufacturing process, a wafer different from the wafer in the process described with reference to FIG. 7 is used.

Next, with a process similar to the process described with reference to FIG. 8, the front surface of the EUV mask MSK0 is irradiated with exposure light, and the resist film 23 of the wafer 21 is irradiated with reflected light obtained as the applied exposure light is reflected from the front surface, thereby performing pattern exposure of the resist film 23 (second EUV exposing process).

Next, with a process similar to the process described with reference to FIG. 9, the resist film 23 subjected to pattern exposure is developed, thereby forming the resist pattern 23a obtained by transferring the exposure pattern (second developing process). Thereafter, the line width of the formed resist pattern 23a is measured (measuring process).

For example, the process of irradiating the resist film 23 with reflected light in part of the main surface of the wafer 21 is repeated a plurality of times. Here, while the region to be irradiated with reflected light on the main surface of the wafer 21 is being scanned, the process of irradiating the resist film 23 with reflected light in part of the region can be repeated a plurality of times. Also, for example, every time the process is performed, the focal position of the reflected light can be changed, thereby performing pattern exposure of the resist film 23. Then, for example, in the measuring process, a value VL3 as a line width of the absorber pattern ABS0 is determined so that the measured change amount of the line width of the resist pattern 23a is smaller than a reference set in advance. With the determined value VL3 as being taken as a value VL1, the value VL1 can be determined.

That is, in the measuring process, the value VL1 can be determined by determining the value VL3 as the line width of the absorber pattern ABS0 so that the measurement value of the line width of the resist pattern 23a is included in a range set in advance and setting the determined value VL3 as the value VL1.

That is, the value VL1 as the line width of the absorber pattern ABS0 is determined so that the value predicted as the line width of the resist pattern 23a formed when the EUV mask MSK1 does not have a phase defect is included in the range in advance. For example, this value VL1 can be set as a value (a pivotal value) designed as an optimum value when the EUV mask MSK1 does not have a phase defect.

Then, before exposure is performed by using the EUV mask MSK1, the EUV mask MSK1 is manufactured. Here, as illustrated in FIG. 20, the EUV mask MSK1 is manufactured so that the line width of the absorber pattern ABS of the EUV mask MSK1 is smaller than the determined value VL1. That is, the EUV mask MSK1 having the absorber pattern ABS with its line width corrected with the value VL2 smaller than the value VL1 as a pivotal value is manufactured.

Here, when the EUV mask MSK1 has a plurality of types of line width as the line width of the absorber pattern ABS, correction can be made according to each line width. Alternatively, even when the EUV mask MSK1 has a plurality of types of line width as the line width of the absorber pattern ABS, the line width of the absorber pattern ABS can be decreased uniformly from both sides by a predetermined width dimension VL4, and the opening width of the absorber pattern ABS can be increased uniformly from both sides by the predetermined dimension VL4. For example, when a quadruple mask is used as an EUV mask, the line width of the absorber pattern ABS can be decreased uniformly from both sides by the predetermined width dimension VL4 of 15 nm, and the opening width of the absorber pattern ABS can be increased uniformly from both sides by the predetermined dimension VL4 of 15 nm.

It is desirable to decrease the line width of the absorber pattern ABS and increase the opening width of the absorber pattern ABS in a range where the transfer characteristic at a normal portion of the EUV mask without a phase defect is not adversely influenced.

In the EUV mask manufactured by performing the process described above, the area of a region where the absorber pattern is not formed, that is, a region reflecting exposure light, is increased. Therefore, exposure can be performed with an exposure condition in which the exposure amount is decreased from the exposure amount required for obtaining a desired pattern dimension when a normal EUV mask is used. As a result, the influence of the phase defect is reduced compared to the case of using a normal EUV mask, and the shape accuracy of the pattern shape in multifocal superposing exposure can be made higher than the shape accuracy of the pattern shape in normal exposure.

<Normal Exposure Using EUV Mask Fabricated by Mask Bias>

When the EUV mask fabricated by mask bias described above is used, even if multifocal superposing exposure is not performed but normal exposure is performed, the influence of the phase defect can be reduced compared to the case of normal exposure using a normal EUV mask. Even if this multifocal superposing exposure is not performed, the EUV mask subjected to, in addition to the normal process described above, a pattern sizing treatment in which the line width of the absorber pattern is decreased and the opening width of the absorber pattern is increased is used. An EUV mask manufacturing process including this pattern sizing process can be performed in a manner similar to that of the EUV mask manufacturing process including the pattern sizing process described above with reference to FIG. 19 and FIG. 20.

Also in the EUV mask fabricated by performing the process described above, exposure can be performed with an exposure condition in which the exposure amount is decreased from the exposure amount required for obtaining a desired pattern dimension when a normal EUV mask is used. As a result, the influence of the phase defect is reduced compared to the case of using a normal EUV mask. Even when multifocal superposing exposure is not performed, the shape accuracy of the pattern shape in multifocal superposing exposure can be made higher than the shape accuracy of the pattern shape in normal exposure.

<Bump Height as Killer Defect>

Next, a bump height as a killer defect, that is, an allowable bump height, when an EUV mask fabricated by mask bias and multifocal superposing exposure are used singly or in combination is described with reference to FIG. 21.

In the following, the case where a normal EUV mask is used to perform normal exposure is taken as a first comparative example, and the case where an EUV mask fabricated by mask bias is used to perform normal exposure is taken as a first example. Also, the case where a normal EUV mask is used to perform multifocal superposing exposure is taken as a second example, and the case where an EUV mask fabricated by mask bias is used to perform multifocal superposing exposure is taken as a third example.

Figure 21:
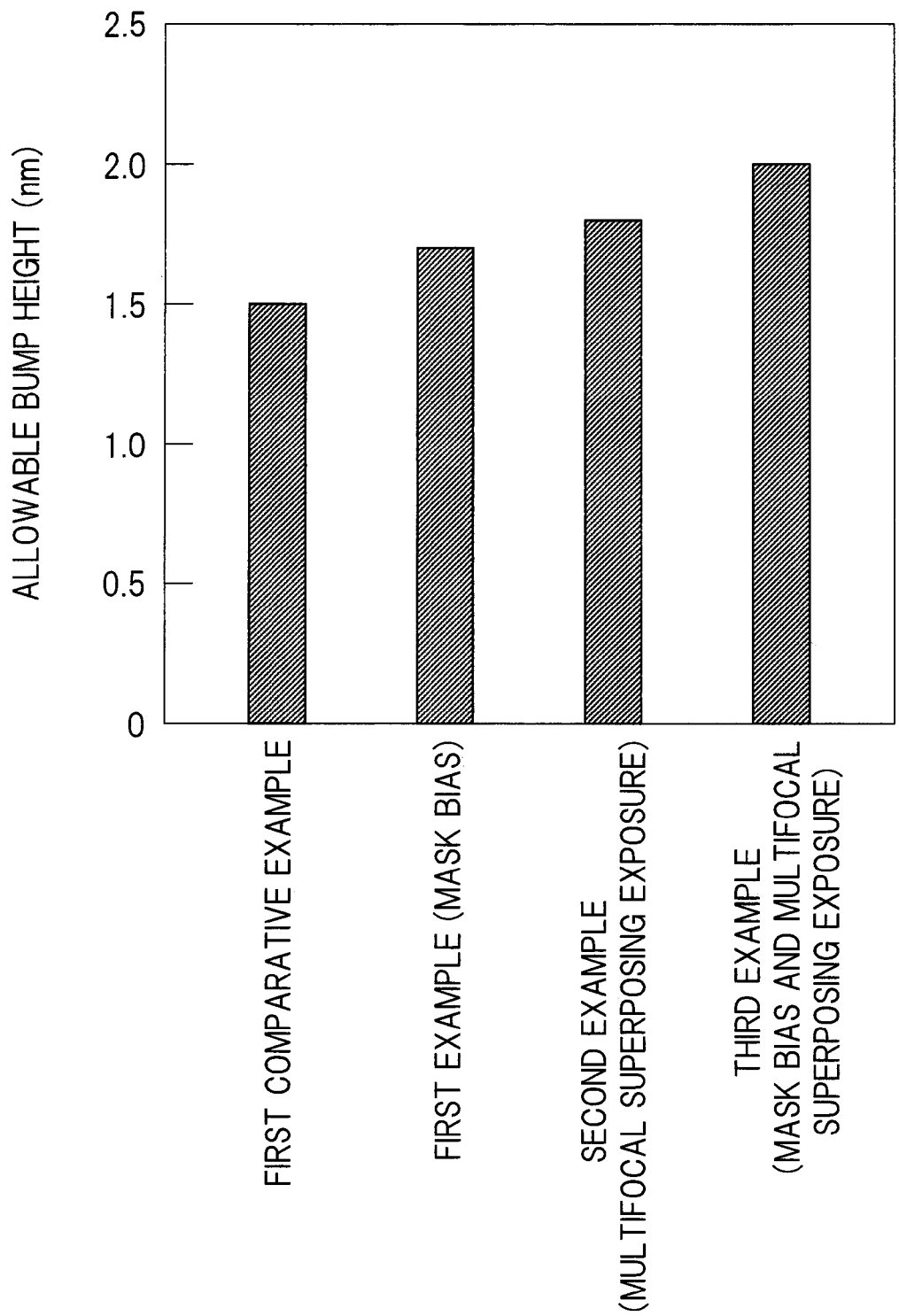
FIG. 21 is a graph illustrating allowable bump heights in a first comparative example and first to third examples.

FIG. 21 is a graph illustrating allowable bump heights in the first comparative example and the first to third examples.

Here, as an EUV mask, one was prepared in which a plurality of types of bump-shaped phase defect with different bump heights having 40 nm in FWHM (Full Width Half Maximum) are arranged between patterns both having a line width of 32 nm and a space width of 32 nm on the wafer and on the front surface of a multilayer reflective film. The allowable bump height was determined by studying the bump height as a killer defect in the case of exposure with an exposure condition of a defocus amount of 100 nm.

The allowable bump height means a bump height as a killer defect. The killer defect means a phase defect which causes a change of the pattern dimension, for example, a change exceeding substantially 5% to 10%.

As illustrated in FIG. 21, the allowable bump height in the first comparative example is 1.5 nm, the allowable bump height in the first example is 1.7 nm, the allowable bump height in the second example is 1.8 nm, and the allowable bump height in the third example is 2.0 nm.

Therefore, compared to the case of normal exposure using a normal EUV mask (the first comparative example), the allowable bump height can be increased when normal exposure is performed by using an EUV mask fabricated by mask bias (the first example). Also, compared to the case of normal exposure using a EUV mask fabricated by mask bias (the first example), the allowable bump height can be further increased when multifocal superposing exposure is performed by using a normal EUV mask (the second example). Furthermore, compared to the case of multifocal superposing exposure using a normal EUV mask (the second example), the allowable bump height can be much further increased when multifocal superposing exposure is performed by using an EUV mask fabricated by mask bias (the third example).

The increase of the allowable bump height means that a reduction of the influence as a phase defect even if the phase defect has a bump shape having the same bump height. That is, with the increase of the allowable bump height, it is possible to reduce a trouble by a minute phase defect that cannot be detected unless inspection accuracy is increased, thereby increasing a lower-limit value of the height of the phase defect to be detected in a defect inspection. Therefore, a defect inspection of the EUV mask can be easily made and, for example, the shape of the absorber pattern of the EUV mask can be easily corrected. For this reason, EUV mask manufacturing cost can be reduced, and TAT (Turn Around Time) in the EUV mask manufacturing process can be reduced.

<Regarding Difficulty in Detecting Phase Defect and Reducing Influence of Phase Defect>

A method of handling a phase defect occurring to the EUV mask includes the following three processes. A first process is a process of inspecting the phase defect. A second process is a process of estimating an absorber pattern correcting method, etc. A third process is a process of correcting the absorber pattern according to the estimation.

In the first process, an inspection of the mask blank before the absorber pattern is formed and an inspection of the mask after the absorber pattern is formed are performed. Of these, as a method of inspecting the mask blank, the exposure-light defect inspecting method described above can be used.

Patent Document 1 describes a method using a dark field as an exposure-light defect inspecting method, and Patent Document 2 describes an X-ray microscopic method using a bright field as an exposure-light defect detecting method. Also, Patent Document 3 describes a method of concurrently using a dark field and a bright field as an exposure-light defect inspecting method, in which a phase defect is detected by using the dark field and the phase defect is identified in the bright field using a Fresnel-zone plate.

The exposure-light defect inspecting method has a high detection sensitivity of detecting a phase defect, and the exposure-light defect inspecting method is thought to be indispensable for an inspection supporting a fine pattern with hp (half pitch) of 32 nm. Among the examples of the exposure-light defect inspecting method described above, the exposure-light bright-light inspecting method has a high detection sensitivity, but a detection signal tends to be buried in noise. Therefore, it is required to decrease the pixel size in a region where a phase defect is to be detected. For this reason, it is disadvantageously difficult to improve throughput and perform a full-field inspection.

In the second process, the influence of the phase defect on the pattern dimension of the pattern to be formed and, for example, the correction amount for correcting the absorber pattern is estimated. To estimate the correction amount, for example, AIMS described above is used. AIMS is an inspection system in which an optical system having a light source of the same wavelength as that of exposure light is used and an enlarged image (an aerial image) of the phase defect or the like is measured by a sensor such as a CCD (Charge Coupled Device). Patent Document 4 describes a method of determining an intensity distribution in an image plane of a projection exposure system based on AIMS.

In the third process, the absorber pattern is corrected. As a process of correcting the absorber pattern, the absorber pattern for a phase defect occurring to the mask blank is corrected, or the absorber pattern for a defect occurring to the absorber pattern is corrected. As a method of correcting the absorber pattern for a phase defect occurring to the mask blank, Patent Document 5 describes a method of deforming or changing the absorber pattern on the front surface of the mask blank adjacent to the phase defect to improve the shape of the pattern to be transferred to the resist film formed on the main surface of the wafer.

As described above, the method of handling a phase defect occurring in the EUV mask includes three processes, and the number of processes may be increased in the EUV mask manufacturing process. Therefore, it is difficult to easily reduce the influence of the phase defect on the pattern dimension of the pattern to be formed.

In particular, in EUV lithography, even an extremely minute phase defect may influence the pattern dimension of the pattern to be formed. For example, when a pattern having a line width of 32 nm and a space width of 32 nm on the wafer is formed, the pattern dimension of the formed pattern fluctuates at a rate more than or equal to 5%, even if a phase defect having a width dimension of 40 nm in FWHM and a height dimension of 1.5 nm is present on the front surface of the multilayer reflective film. For this reason, for a fine pattern with a half pitch (hp) of 22 nm or smaller, the exposure-light defect inspecting method such as the Actinic defect inspecting method is required to be performed as a defect inspection.

However, even if a defect inspection is performed with the Actinic defect inspection method, it is still not easy to inspect a minute phase defect having a half pitch (hp) of 22 nm or smaller as described above, and the light amount of the light source is not sufficient. Therefore, the time required for the defect inspection is disadvantageously long.

Moreover, a defect inspection is required to be performed not only on the mask blank before the EUV mask is manufactured but also on that EUV mask after manufactured. However, when a defect inspection is performed on the EUV mask, an inspection signal receives disturbance of scattered light from the mask pattern, and therefore it is not easy to inspect the minute phase defect described above.

Even if the width dimension of the phase defect requiring an inspection is similar to the conventional width dimension and, for example, 40 nm in FWHM, when the height dimension of the phase defect requiring an inspection is, for example, 2 nm, which is larger than the conventional height dimension, the defect inspection can be performed more easily than before. In this case, if the half pitch (hp) is on the other of 22 nm, the Actinic inspection is not required to be performed as a defect inspection, and a defect inspection using DUV (Deep Ultraviolet) light can be performed. As such, in EUV lithography, an exposure method is desired capable of setting the lower-limit value of the dimension of the phase defect requiring an inspection at a value larger than ever before.

When a phase defect existing in the EUV mask is detected, for example, as described in Patent Document 5, a method has been provided in which the contour of the absorber pattern is corrected at the position where the phase defect is present and its near region. Another method has been provided in which the absorber pattern is formed or corrected so that the position where the phase defect is present comes straight below the absorber pattern.

However, as a result of studies by the inventor, it has been revealed that when part of the phase defect penetrates under the absorber pattern, that part is shadowed by the absorber pattern. Therefore, the position of the phase defect, the influence of the phase defect on the pattern dimension of the pattern to be formed, and others cannot be easily identified. It has been also revealed that a large number of processes are required to correct the EUV mask to decrease correction efficiency. For this reason, disadvantageously, the EUV mask is corrected by trial and error, the number of processes and time required for correction cannot be predicted, and it is difficult to mange EUV mask manufacturing time. Therefore, even if the exposure-light defect inspecting method such as the Actinic defect inspecting method is performed, it is difficult to supply a mask blank and an EUV mask which completely satisfy the requirement for the dimension of the phase defect to be inspected while keeping manufacturing yield and reducing TAT. For this reason, in EUV lithography, the influence of the phase defect on the pattern dimension of the pattern to be formed cannot be easily reduced.

On the other hand, in lithography other than EUV lithography, for example, as FLEX described in Patent Document 6 and Patent Document 7, multifocal superposing exposure may be performed in which multiple exposure is performed while changing the focal position. In the exposure method based on FLEX, multiple exposure is performed while changing the focal position in a range near the depth of focus or superposing exposure is successively performed while changing the focal position in the range near the depth of focus.

Furthermore, as an exposing method with improved FLEX, Patent Document 8 describes a technology in a scanning exposure method of performing exposure while scanning a reticle along an in-plane direction of a substrate, wherein the position of the reticle is repeatedly displaced in a minute distance range along a direction orthogonal to the in-plane direction of the substrate. In the technology described in Patent Document 8, by repeatedly displacing the position of the reticle in the minute distance range along the direction orthogonal to the in-plane direction of the substrate, the focal position is periodically changed along the film thickness direction of the resist film to perform multiple exposure.

In the exposure methods described in Patent Document 6 to Patent Document 8, an optical image by reflected light at a certain depth position is obtained by combining a defocus image with a non-optimum focal position and a best-focus image with an optimal focal position. For this reason, the contrast of the optical image at the certain depth position may be weakened compared to the best-focus image at that depth position.

Also, the exposure methods described in Patent Document 6 to Patent Document 8 are to compensate for a drawback of a small focal depth and to obtain an optical image with its contrast reinforced on average in a wide range of depth positions, in lithography other than EUV lithography.

However, as described above, in EUV lithography, the wavelength of EUV light as exposure light is short, and the depth of focus is inherently large. Therefore, the necessity of using the exposure method based on FLEX described above is low. In EUV lithography where the depth of focus is inherently large, it is not required to perform multiple exposure while changing the focal position in the range near the depth of focus and obtain an optical image with its contrast reinforced on average. Moreover, the exposure methods described in Patent Document 6 to Patent Document 8 are not to solve the problem unique to EUV lithography using an EUV mask as a reflective mask or using an off-telecentric optical system, that is, the problem of reducing the influence of the phase defect on the pattern dimension of the pattern to be formed.

For this reason, in the exposure methods described in Patent Document 6 to Patent Document 8, it is not possible to easily reduce the influence of the phase defect on the pattern dimension of the pattern to be formed in EUV lithography. Moreover, a positional shift occurs in the pattern to be transferred to the resist film formed on the semiconductor device by exposure and, as a result, for example, the shape accuracy of the circuit pattern of the semiconductor device to be manufactured is decreased, thereby decreasing the performance of the semiconductor device.

In particular, in an EUV lithography using an off-telecentric optical system, unlike normal lithography using a telecentric optical system, the exposure magnification fluctuates when the focal position is vertically vibrated in a short period at the time of scan exposure, the position of the pattern to be transferred fluctuates, and the positioning accuracy decreases. To correct the fluctuation of the exposure magnification and the fluctuation of the position of the pattern, a correction optical system is required to be provided separately. However, in EUV lithography, the reflectivity of the multilayer reflecting mirror is 70% or lower. Therefore, if a correction optical system requiring many multilayer reflecting mirrors is provided, the light amount of the reflected light for use in exposure is decreased.

<Main Features and Effects of First Embodiment>

According to the first embodiment, a process of irradiating the resist film with EUV light is repeated a plurality of times while the focal position of EUV light applied to the resist film is changed along the film thickness direction of the resist film, thereby performing pattern exposure on the resist film.

According to the first embodiment, in the EUV mask manufacturing process, when a phase defect occurs in the EUV mask, three processes of defect inspection, estimation of the correction amount, etc., and correction of the absorber pattern are not required to be performed, thereby preventing or suppressing an increase in the number of processes. For this reason, for example, when part of the phase defect penetrates under the absorber pattern, it is possible to prevent the situation in which the position of the phase defect, the influence of the phase defect on the pattern dimension of the pattern to be formed, and others cannot be easily identified. As a result, the EUV mask can be supplied while keeping manufacturing yield and reducing TAT, and it is possible to easily reduce the influence of the phase defect on the pattern dimension of the pattern to be formed in EUV lithography.

Also, according to the first embodiment, suitably, the range of changing the focal position along the film thickness direction is half of the depth of focus or smaller. Therefore, the range of changing the focal position is not required to be substantially equal to the depth of focus or larger than the depth of focus. In this manner, the possibility of weakening the contrast of the optical image at a certain depth position compared to the contrast of the best-focus image at that depth position can be eliminated. Therefore, the problem unique to EUV lithography, that is, a reduction of the influence of the phase defect on the pattern dimension of the pattern to be formed, can be solved. Furthermore, it is possible to prevent or suppress the occurrence of a positional shift in the pattern to be transferred to the resist film formed on the semiconductor substrate by exposure to decrease the shape accuracy of the circuit pattern of the semiconductor device to be manufactured. Therefore, the performance of the semiconductor device can be improved.

Furthermore, according to the first embodiment, suitably, in each exposure, the resist film is irradiated with reflected light, with the focal position of the reflected light being fixed. For this reason, even in EUV lithography using an off-telecentric optical system, it is possible to prevent or suppress the situation in which the exposure magnification fluctuates when the focal position is vertically vibrated in a short period at the time of scan exposure, the position of the pattern to be transferred fluctuates, and the positioning accuracy decreases. Therefore, it is not required to provide a correction optical system for correcting the fluctuation of the exposure magnification and the fluctuation of the position of the pattern, and the possibility of decreasing the light amount of the reflected light for use in exposure due to the provision of the correction optical system can be eliminated.

(Second Embodiment)

Next, a semiconductor device manufacturing process of a second embodiment is described. In the first embodiment described above, the semiconductor device manufacturing process including the exposure process using the EUV mask is described. By contrast, in the second embodiment, an example is described in which the semiconductor device manufacturing process including the exposure process using the EUV mask described in the first embodiment is applied to a NAND gate circuit manufacturing process.

Figure 22:
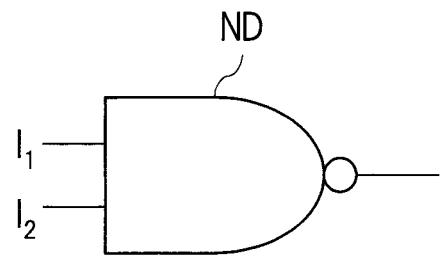
FIG. 22 is a diagram illustrating a NAND gate circuit as a semiconductor device of a second embodiment.
Figure 23:
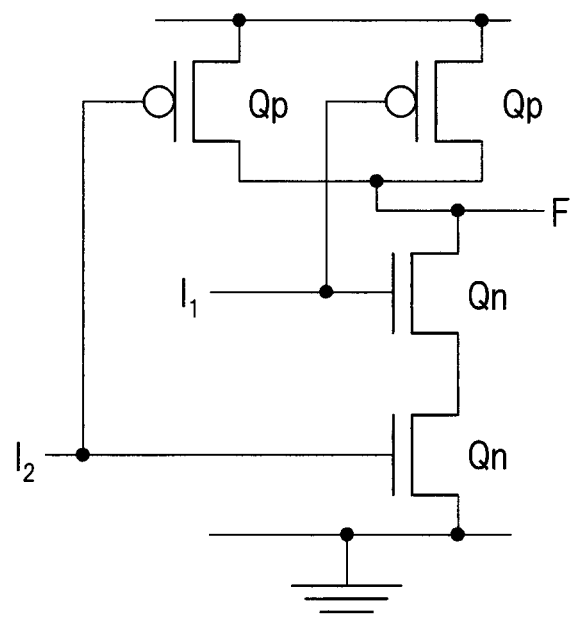
FIG. 23 is a diagram illustrating the NAND gate circuit as the semiconductor device of the second embodiment.

FIG. 22 and FIG. 23 are diagrams illustrating a NAND gate circuit as a semiconductor device of the second embodiment. FIG. 22 is a symbol diagram of the two-input NAND gate circuit. FIG. 23 is a circuit diagram of a two-input NAND gate circuit ND. The two-input NAND gate circuit ND as the semiconductor device of the second embodiment has two inputs $I_1$ and $I_2$ illustrated in FIG. 22 and FIG. 23, and has an output F as illustrated in FIG. 23.

Figure 24:
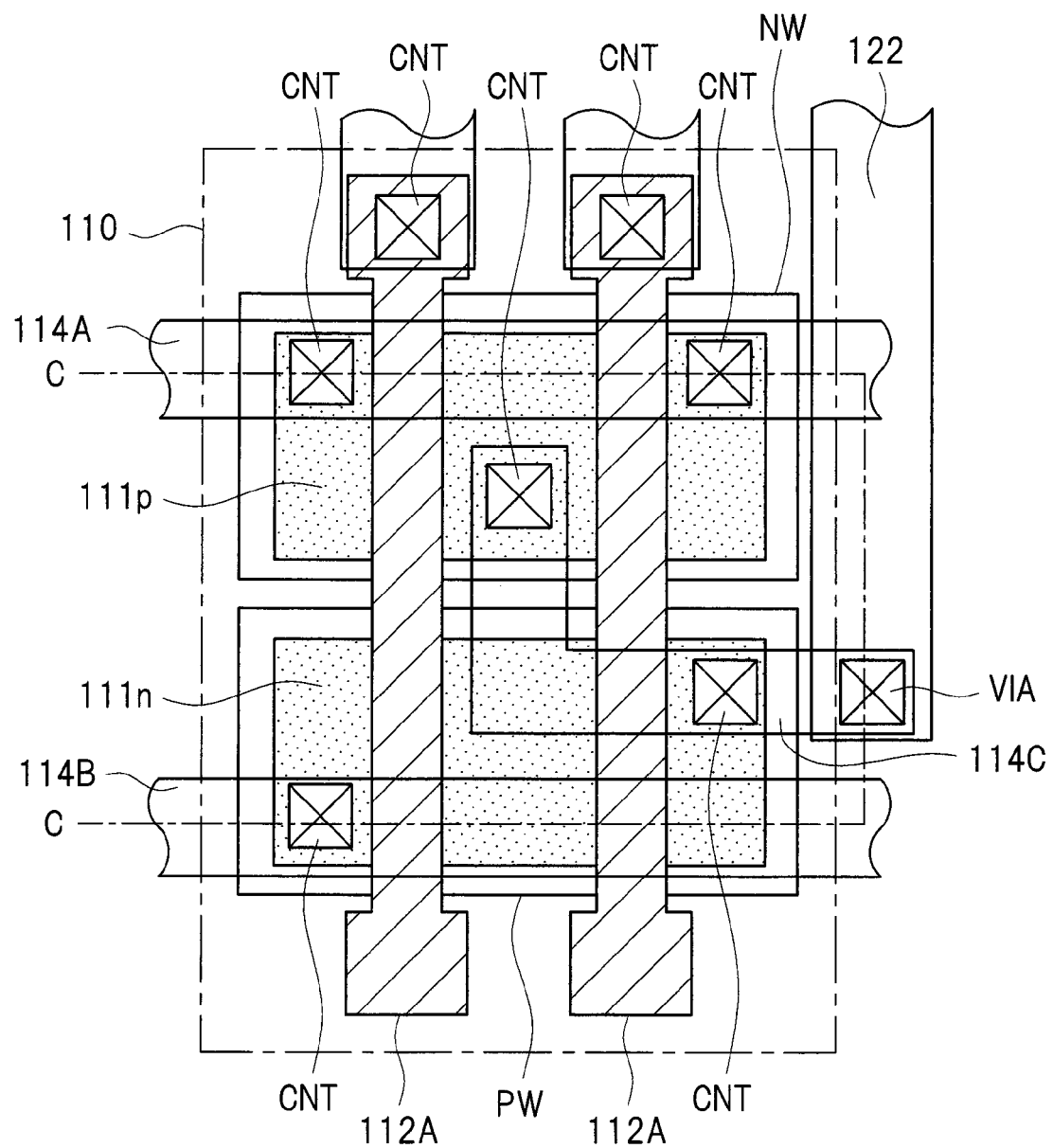
FIG. 24 is a diagram illustrating a layout of the NAND gate circuit as the semiconductor device of the second embodiment.

FIG. 24 is a diagram illustrating the layout of the NAND gate circuit of the semiconductor device of the second embodiment. FIG. 25 to FIG. 30 are plan views for describing a mask for use in the semiconductor device manufacturing process of the second embodiment.

In FIG. 24, a portion surrounded by a one-dot chain is a unit cell 110. The unit cell 110, which will be described further below with reference to FIG. 40, etc., has two n-channel-type MISFETs (Metal Insulator Semiconductor Field Effect Transistors) Qn formed on an $n^+$-type diffusion layer 111$n$ on a front surface of a p-type well region PW. Also, the unit cell 100, which will be described further below with reference to FIG. 40, etc., is configured of two p-channel-type MISFETs Qp formed on the $p^+$-type diffusion layer 111($p$ on a front surface of the n-type well region NW. The n-channel-type MISFETs Qn and the p-channel-type MISFETs Qp are illustrated in the circuit diagram of FIG. 23.

To fabricate the two-input NAND gate circuit ND, as illustrated in FIG. 1, the exposing apparatus 1 including the exposure mechanism unit 1a having the EUV light source 2, the reflective illumination optical system 3, the mask stage 4, the reduced projection optical system 5, and the wafer stage 6 is prepared as illustrated in FIG. 1. Also, by sequentially using masks M1 to M6 as illustrated in FIG. 25 to FIG. 30, pattern transfer to the wafer is repeated. Of these masks, the masks M1 to M3 where a pattern of a relatively large size is formed are normal photolithography masks. On the other hand, the masks M4 to M6 where a fine pattern requiring a high dimensional accuracy is formed are masks for EUV lithography (EUV masks).

Figure 25:
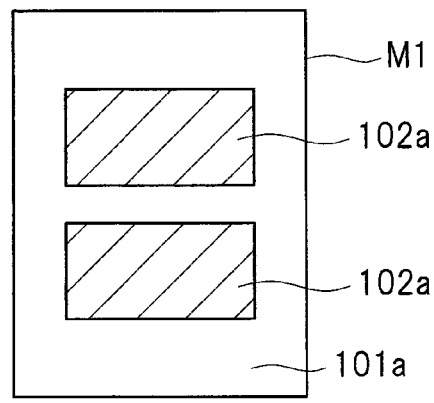
FIG. 25 is a plan view for describing a mask for use in a manufacturing process of the semiconductor device of the second embodiment.

In the mask M1 illustrated in FIG. 25, a reference numeral 101a denotes a transmissive region, and a reference numeral 102a denotes an absorption region. In the mask M2 illustrated in FIG. 26, a reference numeral 101b denotes a transmissive region, and a reference numeral 102b denotes an absorption region. In the mask M3 illustrated in FIG. 27, a reference numeral 101c denotes a transmissive region, and a reference numeral 102c denotes an absorption region.

Figure 28:
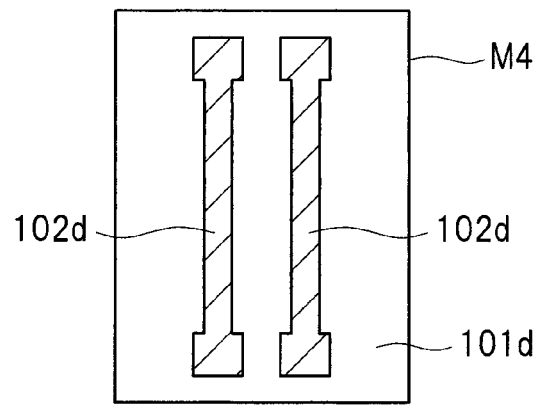
FIG. 28 is a plan view for describing the mask for use in the manufacturing process of the semiconductor device of the second embodiment.

In the mask M4 illustrated in FIG. 28, a reference numeral 101d denotes a reflective region, and a reference numeral 102d denotes an absorption region. In the mask M5 illustrated in FIG. 29, a reference numeral 101e denotes a reflective region, and a reference numeral 102e denotes an absorption region. In the mask M6 illustrated in FIG. 30, a reference numeral 101*f* denotes a reflective region, and a reference numeral 102*f* denotes an absorption region.

In the second embodiment, as the masks M4, M5, and M6, the EUV masks MSK1 (refer to FIG. 3) described in the first embodiment can be used. Here, the reflective regions 101*d*, 101*e*, and 101*f* of the masks M4, M5, and M6, respectively, are each formed of, for example, the multilayer reflective film (the reflective film) ML described with reference to FIG. 3. The absorption regions 102*d*, 102*e*, and 102*f* of the masks M4, M5, and M6, respectively, are each formed of, for example, the absorber pattern ABS described with reference to FIG. 3.

Next, a specific process of the semiconductor device manufacturing process of the second embodiment is described. First, the procedure up to a process of forming the n-channel-type MISFETs Qn (refer to FIG. 40) and the p-channel-type MISFETs Qp (refer to FIG. 40) is described with reference to FIG. 31 to FIG. 40. FIG. 31 to FIG. 40 are cross-sectional views of main parts of the semiconductor device during a manufacturing process of the second embodiment. FIG. 31 to FIG. 40 are cross-sectional views along a C-C line of FIG. 24.

Figure 31:
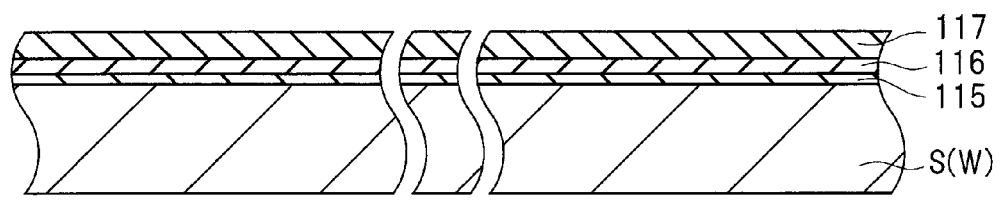
FIG. 31 is a cross-sectional view of main parts of the semiconductor device during the manufacturing process of the second embodiment.

First, as illustrated in FIG. 31, on a wafer W (a semiconductor substrate S) made of p-type single crystal silicon, for example, an insulating film 115 made of a silicon oxide is formed by oxidation, and then a silicon nitride film 116 is deposited on the insulating film 15 by CVD (Chemical Vapor Deposition). Then, a resist (a photoresist) is applied onto the silicon nitride film 116, and a heat treatment is performed, thereby forming a resist film (a photoresist film) 117.

Figure 32:
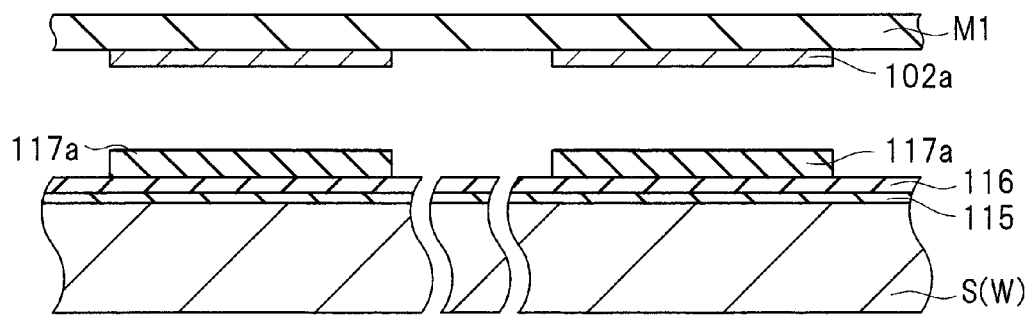
FIG. 32 is a cross-sectional view of main parts of the semiconductor device during the manufacturing process of the second embodiment.

Next, as illustrated in FIG. 32, by performing an exposure process and a developing process on the resist film 117 using the mask M1 where the pattern illustrated in FIG. 25 is formed, a resist pattern 117*a* is formed on the silicon nitride film 116. The absorption region 102*a* is a light-shielding film, and made of, for example, Cr.

Figure 33:
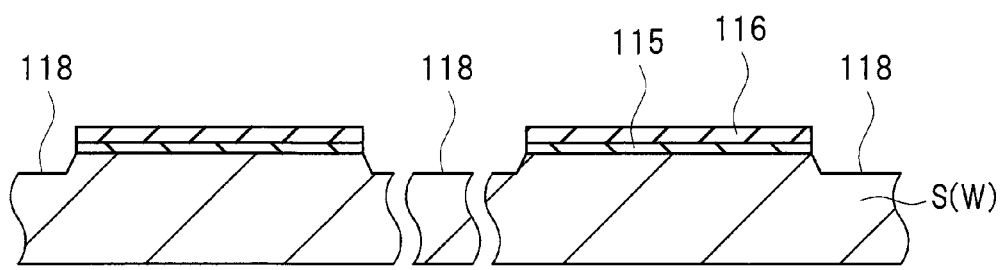
FIG. 33 is a cross-sectional view of main parts of the semiconductor device during the manufacturing process of the second embodiment.

Next, after the silicon nitride film 116 and the insulating film 115 are subjected to dry etching with the resist pattern 117*a* (refer to FIG. 32) as a mask, the resist pattern 117*a* is removed. Subsequently, with the silicon nitride film 116 as a mask, the front surface of the semiconductor substrate S is subjected to dry etching, thereby forming a trench 118 as illustrated in FIG. 33.

Figure 34:
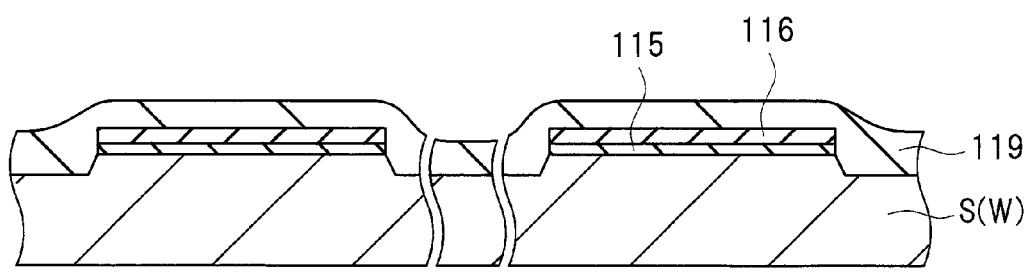
FIG. 34 is a cross-sectional view of main parts of the semiconductor device during the manufacturing process of the second embodiment.
Figure 35:
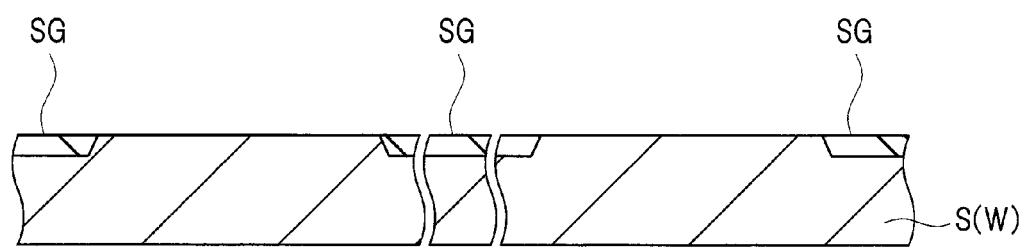
FIG. 35 is a cross-sectional view of main parts of the semiconductor device during the manufacturing process of the second embodiment.

Next, as illustrated in FIG. 34, an insulating film 119 made of, for example, a silicon oxide, is deposited on the semiconductor substrate S by CVD. Next, the insulating film 119 is planarized by CMP (Chemical Mechanical Polishing), and then the silicon nitride film 116 and the insulating film 115 are removed. In this manner, as illustrated in FIG. 35, a device isolation trench SG is formed on in a front surface of the semiconductor substrate S. While device isolation is performed with the device isolation trench SG herein, this is not meant to be restrictive. For example, device isolation may be performed with a field insulating film formed by LOCOS (Local Oxidization of Silicon).

Figure 26:
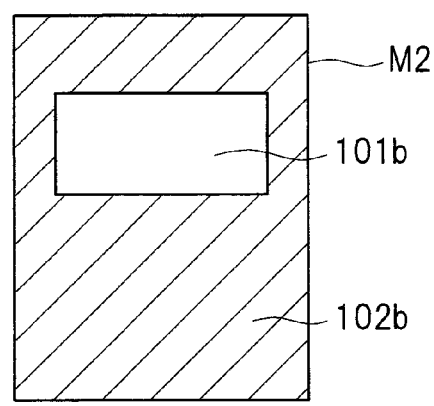
FIG. 26 is a plan view for describing the mask for use in the manufacturing process of the semiconductor device of the second embodiment.
Figure 36:
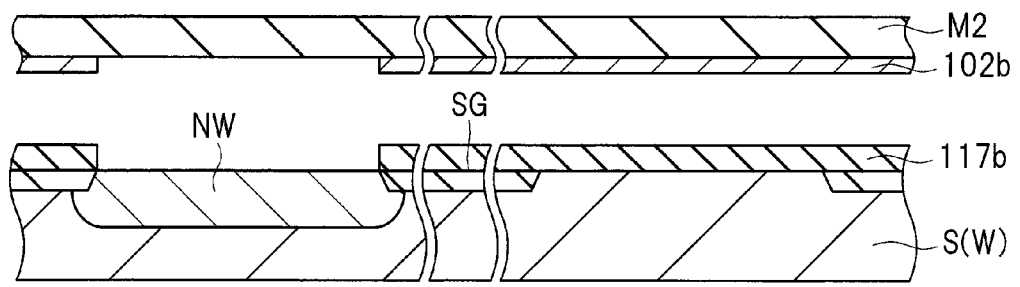
FIG. 36 is a cross-sectional view of main parts of the semiconductor device during the manufacturing process of the second embodiment.

Next, as illustrated in FIG. 36, a resist film (a photoresist film) formed on the semiconductor substrate S is subjected to an exposing process and a developing process using the mask M2 where the pattern illustrated in FIG. 26 is formed, thereby forming a resist pattern 117*b*. Subsequently, for example, phosphorus or arsenic is ion-implanted in a region of the semiconductor substrate S not covered with the resist pattern 117*b*, thereby forming an n-type well region NW. The absorption region 102*b* is a light-shielding film, and is made of, for example, Cr.

Figure 27:
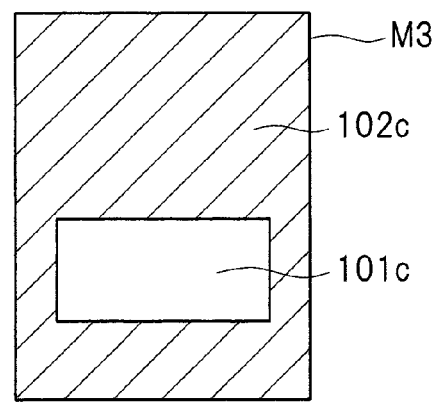
FIG. 27 is a plan view for describing the mask for use in the manufacturing process of the semiconductor device of the second embodiment.
Figure 37:
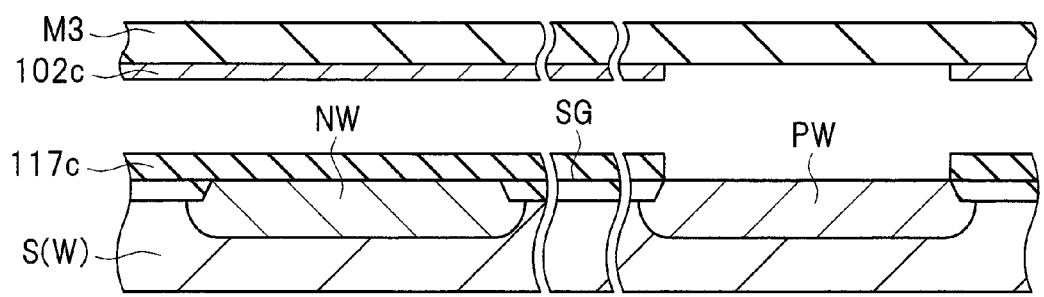
FIG. 37 is a cross-sectional view of main parts of the semiconductor device during the manufacturing process of the second embodiment.

Next, after the resist pattern 117*b* is removed, as illustrated in FIG. 37, the resist film (the photoresist film) formed on the semiconductor substrate S is subjected to an exposing process and a developing process by using the mask M3 where the pattern illustrated in FIG. 27 is formed, thereby forming a resist pattern 117*c*. Subsequently, for example, boron is ion-implanted in a region of the semiconductor substrate S not covered with the resist pattern 117*c*, thereby forming a p-type well region PW. The absorption region 102*c* is a light-shielding film, and is made of, for example, Cr.

Figure 38:
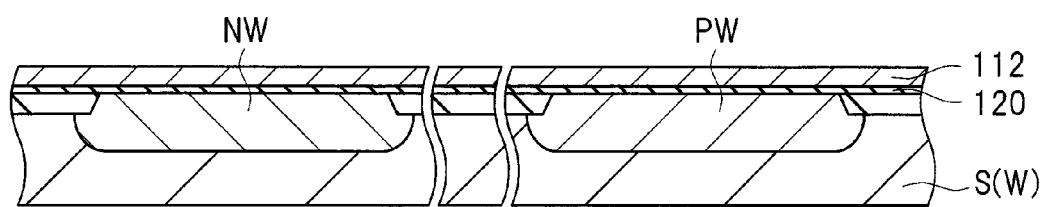
FIG. 38 is a cross-sectional view of main parts of the semiconductor device during the manufacturing process of the second embodiment.

Next, as illustrated in FIG. 38, after an insulating film 120 made of, for example, a silicon oxide, and having a film thickness on the order of 2 nm is formed on the front surface of the semiconductor substrate S, a conductive film 112 formed of, for example, a laminated film of a polycrystalline silicon film and a tungsten film, is deposited by CVD on the insulating film 120.

Figure 39:
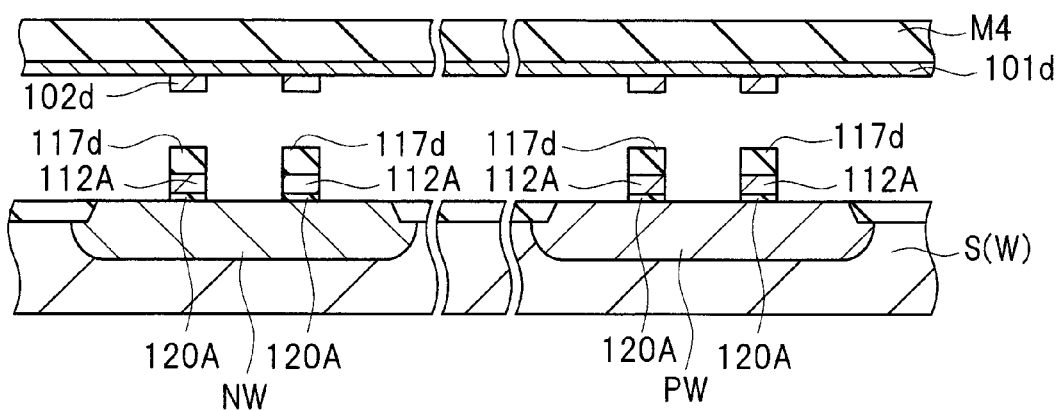
FIG. 39 is a cross-sectional view of main parts of the semiconductor device during the manufacturing process of the second embodiment.

Next, the mask M4 having the pattern illustrated in FIG. 28 formed thereon is prepared. As illustrated in FIG. 39, after a resist film (a photoresist film) formed on the conductive film 112 is subjected to an exposing process, a developing process is performed, thereby forming a resist pattern 117*d*. Subsequently, with the resist pattern 117*d* as a mask, the conductive film 112 and the insulating film 120 are subjected to dry etching. In this manner, a gate electrode 112A and a gate insulating film 120A configuring the n-channel-type MISFETs Qn (refer to FIG. 40) and a gate electrode 112A and a gate insulating film 120A configuring the p-channel-type MISFETs Qp (refer to FIG. 40) are formed. The reflective region 101*d* is formed of, for example, the multilayer reflective film (the reflective film) ML described with reference to FIG. 3. The absorption region 102*d* is formed of, for example, the absorber pattern ABS described with reference to FIG. 3.

To the processes illustrated in FIG. 38 and FIG. 39 described above, the semiconductor device manufacturing process described with reference to FIG. 7 to FIG. 11 in the first embodiment can be applied.

That is, as illustrated in FIG. 7, the resist film 23 is formed on the workpiece film 22 (corresponding to the insulating film 120 and the conductive film 112 of FIG. 38). Next, as illustrated in FIG. 8, the reflected light 2*b* reflected from the pattern surface PS1 of the EUV mask MSK1 (corresponding to the mask M4 of FIG. 39) is applied to the resist film 23 via the reduced projection optical system 5 (refer t FIG. 1), thereby performing pattern exposure of the resist film 23.

Next, as illustrated in FIG. 9, by developing the resist film (the photoresist film) subjected to pattern exposure, a resist pattern 23*a* (corresponding to the resist pattern 117*d* of FIG. 39) with the exposure pattern including the absorber pattern ABS of the EUV mask MSK1 transferred thereto is formed. Next, as illustrated in FIG. 10, by using the resist pattern 23*a* as an etching mask, the workpiece film (the film to be etched) 22 is processed (etched). In this manner, as illustrated in FIG. 11, the pattern 22*a* (corresponding to the gate electrode 112A and the gate insulating film 120A of FIG. 39) with the exposure pattern including the absorber pattern ABS of the EUV mask MSK1 transferred thereto is formed.

In the process illustrated in FIG. 39 described above, the process of performing pattern exposure of the resist film 23 can be performed in a manner similar to that of the EUV exposing process (step S14 of FIG. 6) described with reference to FIG. 6 in the first embodiment, and the exposing method including multifocal superposing exposure described in the first embodiment can be used. Also, as described in the first embodiment, as the EUV mask MSK1 (the mask M4), an EUV mask fabricated by mask bias where the line width of the absorber pattern is decreased and the opening width thereof is increased with respect to the value (the pivotal value) designed as an optimum value when no phase defect is present can be used. Therefore, it is possible to supply the EUV mask while keeping manufacturing yield and reducing TAT, and the influence of the phase defect on the pattern dimension of the pattern to be formed in EUV lithography can be easily reduced. For this reason, the shape accuracy of the formed gate electrode 112A and gate insulating film 120A can be improved.

Figure 40:
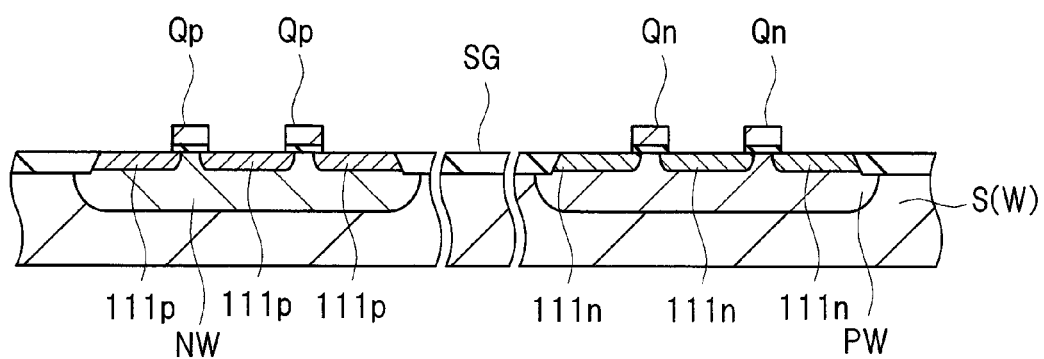
FIG. 40 is a cross-sectional view of main parts of the semiconductor device during the manufacturing process of the second embodiment.

Next, after the resist pattern 117d is removed, as illustrated in FIG. 40, for example, phosphorus or arsenic is ion-implanted in the p-type well region PW, thereby forming the $n^+$-type diffusion layer 111n configuring the source and drain of the n-channel-type MISFETs Qn in a self-alignment manner. Also, by ion-implanting boron or the like in the n-type well region NW, the $p^+$-type diffusion layer 111p configuring the source and drain of the p-channel-type MISFETs Qp is formed in a self-alignment manner. Up to this process, the n-channel-type MISFETs Qn and the p-channel-type MISFETs Qp are completed.

Next, a wiring forming process is described with respect to FIG. 41 to FIG. 46. FIG. 41 to FIG. 46 are cross-sectional views of main parts of the semiconductor device during a manufacturing process of the second embodiment. As with FIG. 31 to FIG. 40, FIG. 41 to FIG. 46 are cross-sectional views along a C-C line of FIG. 24.

Figure 41:
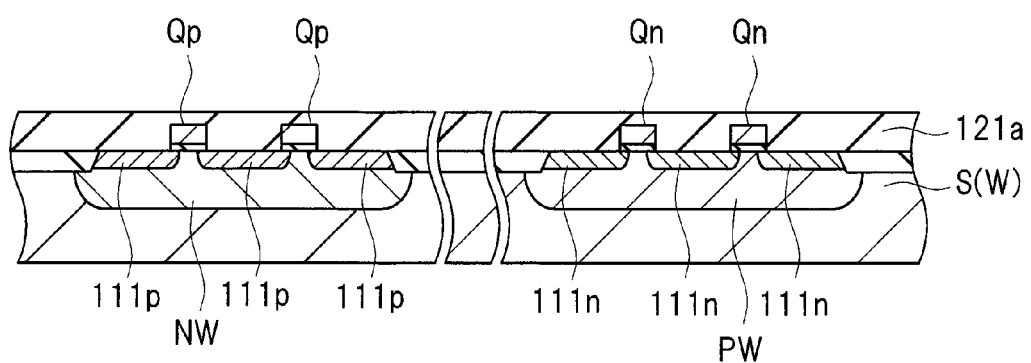
FIG. 41 is a cross-sectional view of main parts of the semiconductor device during the manufacturing process of the second embodiment.

First, as illustrated in FIG. 41, an interlayer insulating film 121a made of, for example, a silicon oxide, is deposited by CVD on an upper portion of the n-channel-type MISFETs Qn and the p-channel-type MISFETs Qp.

Figure 29:
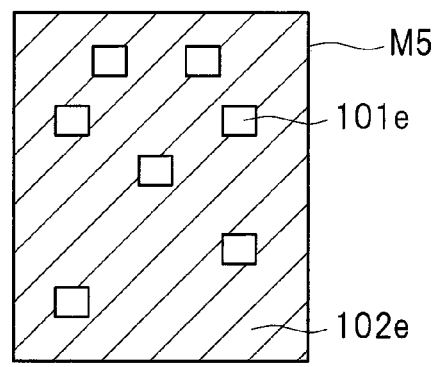
FIG. 29 is a plan view for describing the mask for use in the manufacturing process of the semiconductor device of the second embodiment.
Figure 30:
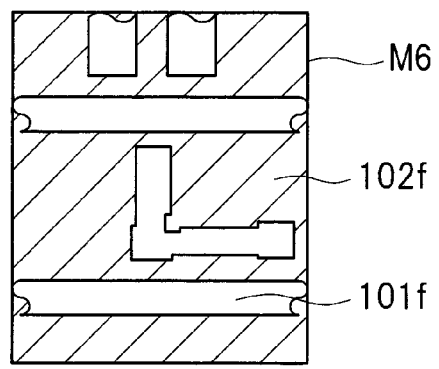
FIG. 30 is a plan view for describing the mask for use in the manufacturing process of the semiconductor device of the second embodiment.
Figure 42:
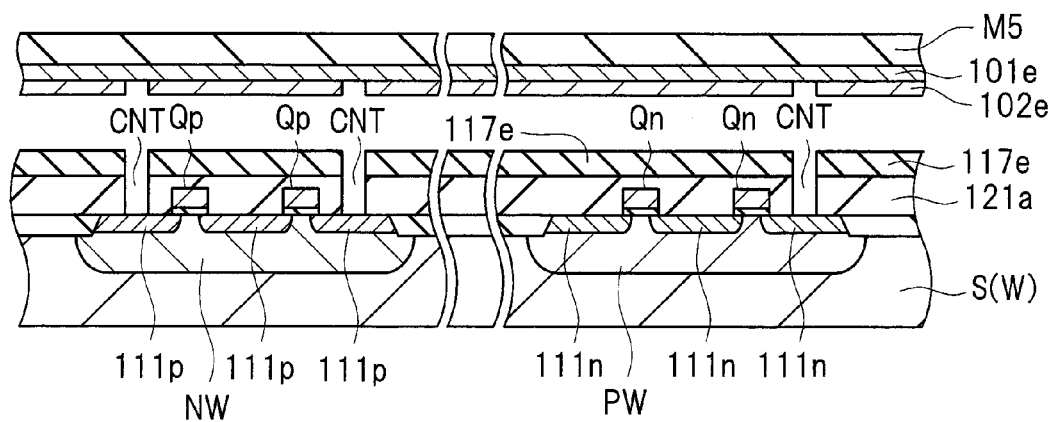
FIG. 42 is a cross-sectional view of main parts of the semiconductor device during the manufacturing process of the second embodiment.

Next, the mask M5 having the pattern illustrated in FIG. 29 formed thereon is prepared. As illustrated in FIG. 42, after a resist film (a photoresist film) formed on the interlayer insulating film 121a is subjected to an exposing process, a developing process is performed, thereby forming a resist pattern 117e. Subsequently, with the resist pattern 117e taken as a mask, the interlayer insulating film 121a is subjected to dry etching. In this manner, contact holes CNT are formed in the interlayer insulating film 121a and in an upper portion of the $n^+$-type diffusion layer 111n and the $p^+$-type diffusion layer 111p. The reflective region 101e is formed of, for example, the multilayer reflective film (the reflective film) ML described with reference to FIG. 3. The absorption region 102e is formed of, for example, the absorber pattern ABS described with reference to FIG. 3.

As with the process illustrated in FIG. 39, to the process illustrated in FIG. 42 described above, the semiconductor device manufacturing process described with reference to FIG. 7 to FIG. 11 in the first embodiment can be applied. Also, in the process illustrated in FIG. 42 described above, the process of performing pattern exposure of the resist film can be performed in a manner similar to that of the EUV exposing process (step S14 of FIG. 6) described with reference to FIG. 6 in the first embodiment, and the exposing method including multifocal superposing exposure described in the first embodiment can be used.

Also, as described in the first embodiment, as the EUV mask MSK1 (the mask M5), an EUV mask fabricated by mask bias where the line width of the absorber pattern is decreased and the opening width thereof is increased with respect to the value (the pivotal value) designed as an optimum value when no phase defect is present can be used. Therefore, it is possible to supply the EUV mask while keeping manufacturing yield and reducing TAT, and the influence of the phase defect on the pattern dimension of the pattern to be formed in EUV lithography can be easily reduced. For this reason, the shape accuracy of the formed contact holes CNT can be improved.

Figure 43:
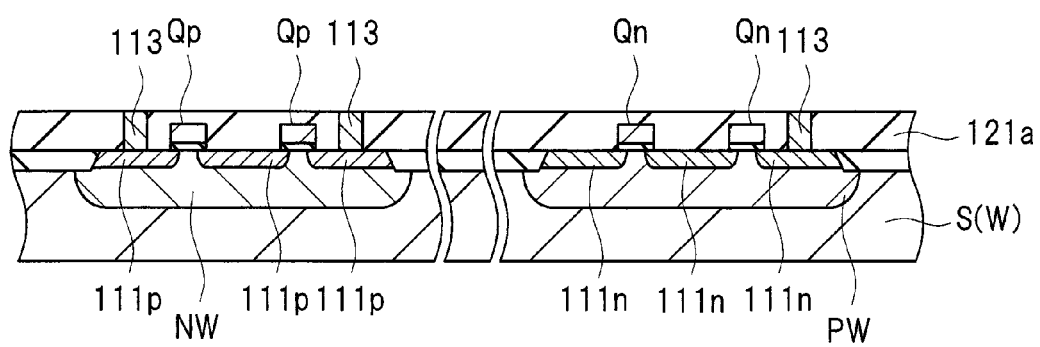
FIG. 43 is a cross-sectional view of main parts of the semiconductor device during the manufacturing process of the second embodiment.

Next, after the resist pattern 117e is removed, as illustrated in FIG. 43, a metal film made of, for example, tungsten (W), a tungsten alloy, or copper (Cu), is buried inside the contact holes CNT. Subsequently, the front surface of the metal film is planarized by CMP. In this manner, metal plugs 113 are formed inside the contact holes CNT.

Figure 44:
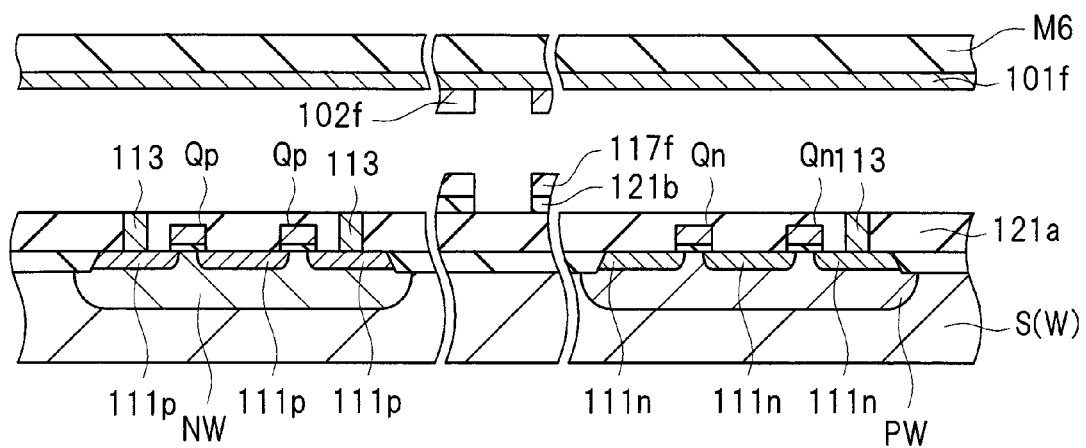
FIG. 44 is a cross-sectional view of main parts of the semiconductor device during the manufacturing process of the second embodiment.

Next, as illustrated in FIG. 44, an interlayer insulating film 121b made of, for example, a silicon oxide, is deposited by CVD on the interlayer insulating film 121a. Subsequently, the mask M6 having the pattern illustrated in FIG. 30 formed thereon is prepared. After a resist film (a photoresist film) formed on the conductive film 112 is subjected to an exposing process, a developing process is performed, thereby forming a resist pattern 117f. Subsequently, with resist pattern 117f as a mask, the interlayer insulating film 121b is subjected to dry etching. The reflective region 101f is formed of, for example, the multilayer reflective film (the reflective film) ML described with reference to FIG. 3. The absorption region 102f is formed of, for example, the absorber pattern ABS described with reference to FIG. 3.

As with the process illustrated in FIG. 42, to the process illustrated in FIG. 44 described above, the semiconductor device manufacturing process described with reference to FIG. 7 to FIG. 11 in the first embodiment can be applied. In the process illustrated in FIG. 44 described above, the process of performing pattern exposure of the resist film can be performed in a manner similar to that of the EUV exposing process (step S14 of FIG. 6) described with reference to FIG. 6 in the first embodiment, and the exposing method including multifocal superposing exposure described in the first embodiment can be used.

Furthermore, as described in the first embodiment, as the EUV mask MSK1 (the mask M6), an EUV mask fabricated by mask bias where the line width of the absorber pattern is decreased and the opening width thereof is increased with respect to the value (the pivotal value) designed as an optimum value when no phase defect is present can be used. Therefore, it is possible to supply the EUV mask while keeping manufacturing yield and reducing TAT, and the influence of the phase defect on the pattern dimension of the pattern to be formed in EUV lithography can be easily reduced. Also, the shape accuracy of the pattern formed by dry etching of the interlayer insulating film 121b can be improved.

Figure 45:
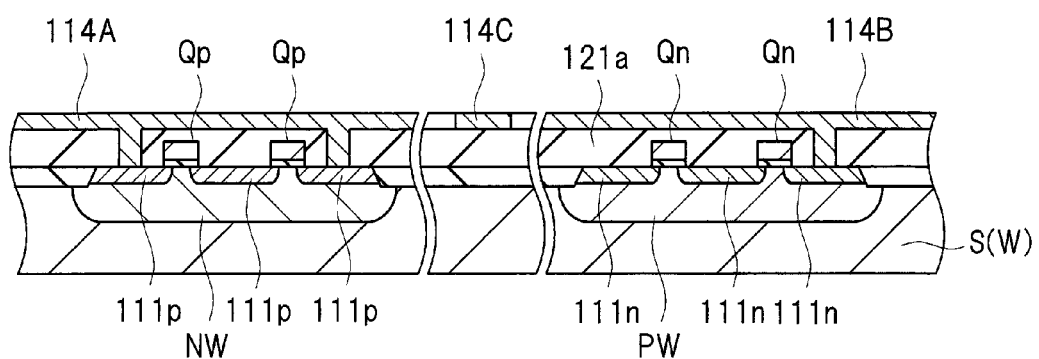
FIG. 45 is a cross-sectional view of main parts of the semiconductor device during the manufacturing process of the second embodiment.

Next, after the resist pattern 117f is removed, as illustrated in FIG. 45, a metal film made of, for example, copper, is deposited by sputtering. Subsequently, the front surface of this metal surface is planarized by CMP, thereby forming wirings 114A, 114B, and 114C.

Figure 46:
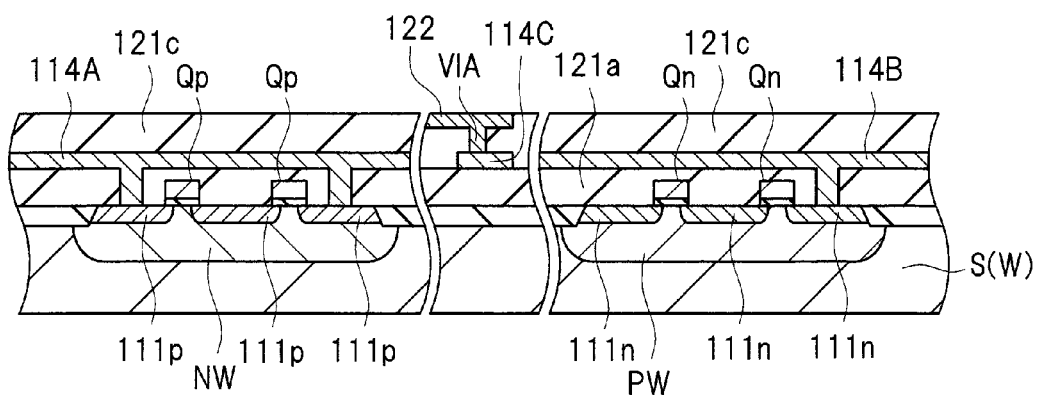
FIG. 46 is a cross-sectional view of main parts of the semiconductor device during the manufacturing process of the second embodiment.

Next, as illustrated in FIG. 46, an interlayer insulating film 121c made of, for example, a silicon oxide, is deposited by CVD on an upper portion of the wirings 114A, 114B, and 114C. Then, by using an EUV mask different from the EUV mask described with reference to FIG. 25 to FIG. 30, a through hole VIA is formed in the interlayer insulating film 121c above the wiring 114C. Then, a second layer wiring 122 connected to the wiring 114C via the through hole VIA is formed, thereby completing the two-input NAND gate. By changing the shape and position of the opening pattern formed in the masks M5 and M6, another circuit such as an NOR gate circuit can be formed.

As described above, in the second embodiment, the EUV masks MSK1 of the first embodiment were used as the masks M4, M5, and M6, and the exposing method including multifocal superposing exposure described in the first embodiment was applied as EUV lithography using the masks M4, M5, and M6. Also, as the masks M4, M5, and M6, as described in the first embodiment, EUV masks MSK1 fabricated by mask bias where the line width of the absorber pattern is decreased and the opening width thereof is increased with respect to the value (the pivotal value) designed as an optimum value when no phase defect is present were used. Furthermore, an EUV mask defect inspection in the second embodiment was performed by mitigating conventional phase defect inspection standards in which the width dimension is 40 nm in FWHM and the height dimension is 1.5 nm to new phase defect inspection standards in which the width dimension is 40 nm in FWHM and the height dimension is 2.0 nm.

As a result, in spite of the fact that the phase defect inspection standards were mitigated, a defect due to a transfer defect did not occur in the transfer pattern. Also, by mitigating the defect inspection standards, the time for inspecting the EUV mask and the mask blank was reduced by half, and manufacturing yields of the EUV mask and the mask blank were improved.

That is, according to the semiconductor device manufacturing method of the second embodiment, EUV mask manufacturing cost can be reduced and TAT in the EUV mask manufacturing process can be reduced. Also, according to the semiconductor device manufacturing method of the second embodiment, in EUV lithography using an off-telecentric optical system, the influence of the phase defect can be reduced, and it is possible to prevent or suppress a decrease of the shape accuracy of the circuit pattern of the semiconductor device to be manufactured. For this reason, semiconductor integrated circuits with a desired electrical characteristic can be manufactured with high reliability and high yield, and the performance of the semiconductor device can be improved.

As with the first embodiment, even if either one of the EUV mask fabricated by mask bias and multifocal superposing exposure is used singly, the influence of the phase defect can be reduced, although the effect is less than that when the EUV mask and multifocal superposing exposure are used in combination.

In the foregoing, the invention made by the inventor of the present invention has been concretely described based on the embodiments. However, it is needless to say that the present invention is not limited to the foregoing embodiments and various modifications and alterations can be made within the scope of the present invention.

The present invention includes at least an embodiment as follows.

[Rider]

A method of manufacturing a semiconductor device comprising the steps of:

(a) holding a first mask by a mask holding unit, the first mask having a first base, a first reflective film formed on a first front surface of the first base to reflect first exposure light, and a first absorber pattern formed on the first reflective film to absorb the first exposure light;

(b) forming a first resist film on a first film to be etched, which is formed on a main surface of a first substrate;

(c) after the step (b), holding the first substrate by a substrate holding unit;

(d) irradiating the first front surface of the first mask being held by the mask holding unit with the first exposure light and irradiating the first resist film of the first substrate being held by the substrate holding unit with first reflected light, which is the first exposure light for irradiation reflected from the first front surface;

(e) after the step (d), forming a first resist pattern by developing the first resist film;

(f) etching the first film to be etched, by using the first resist pattern as an etching mask;

(g) before the step (a), determining a line width of the first absorber pattern; and (h) after the step (g) and before the step (a), manufacturing the first mask, in which, in the step (g), a first value is determined as a line width of the first absorber pattern so that a line width of the first resist pattern that is formed when the first mask does not have a phase defect is included in a first range set in advance, and, in the step (h), the first mask having the first absorber pattern with a line width obtained by correction to a second value that is smaller than the first value is manufactured.

What is claimed is:

1. A method of manufacturing a semiconductor device comprising the steps of:
   (a) holding a first mask by a mask holding unit, the first mask having a first base, a first reflective film formed on a first front surface of the first base to reflect first exposure light, and a first absorber pattern formed on the first reflective film to absorb the first exposure light;
   (b) forming a first resist film on a first film to be etched, which is formed on a main surface of a first substrate;
   (c) after the step (b), holding the first substrate by a substrate holding unit;
   (d) irradiating the first front surface of the first mask being held by the mask holding unit with the first exposure light and irradiating the first resist film of the first substrate being held by the substrate holding unit with first reflected light, which is the first exposure light for irradiation reflected from the first front surface;
   (e) after the step (d), forming a first resist pattern by developing the first resist film; and
   (f) etching the first film to be etched, by using the first resist pattern as an etching mask,
   wherein, in the step (d), the irradiation of the first reflected light is repeated while a focal position of the first reflected light with which the first resist film is irradiated is changed along a film thickness direction of the first resist film, and
   in the step (d), the focal position of the first reflected light is changed in a range smaller than or equal to half of a depth of focus,
   the method further comprising the steps of:
   (g) before the step (a), determining a line width of the first absorber pattern, a first value being determined as the line width of the first absorber pattern so that a line width of the first resist pattern that is formed when the first mask does not have a phase defect is included in a first range set in advance; and
   (h) after the step (g) and before the step (a), manufacturing the first mask, the first mask having the first absorber pattern with a corrected line width obtained by correcting a second value that is smaller than the first value, the line width of the first absorber pattern being corrected to the second value by uniformly decreasing the line width of the first absorber pattern from both sides,
   wherein in the step (d), the first exposure light is irradiated with an exposure condition in which an exposure amount is decreased from the exposure amount when the line width of the first absorber pattern is not corrected to the second value, and
   the first exposure light is extreme ultraviolet light.

2. The semiconductor device manufacturing method according to claim 1, wherein the step (d) includes the step of:
   (i) irradiating the first resist film with the first reflected light, while the focal position of the first reflected light is being fixed, and, in the step (d), the step (i) is repeated, and the focal position of the first reflected light is changed every time the step (i) is repeated.

3. The method of manufacturing a semiconductor device according to claim 2, wherein, in the step (i), the irradiation of the first reflected light is repeated while a region of the main surface of the first substrate to be irradiated with the first reflected light is scanned.

4. The method of manufacturing a semiconductor device according to claim 1, wherein, in the step (d), the irradiation of the first reflected light is repeated while the focal position of the first reflected light is being changed and an exposure magnification is being corrected so that the exposure magnification is not changed before and after the change of the focal position of the first reflected light.

5. The method of manufacturing a semiconductor device according to claim 1, wherein the step (g) includes the steps of:
  (g1) holding a second mask by the mask holding unit, the second mask having a second base, a second reflective film formed on a second front surface of the second base to reflect second exposure light, and a second absorber pattern formed on the second reflective film to absorb the second exposure light, and the second mask without a phase defect;
  (g2) forming a second resist film on a second film to be etched that is formed on a main surface of a second substrate;
  (g3) after the step (g2), holding the second substrate by the substrate holding unit;
  (g4) irradiating the second front surface of the second mask held by the mask holding unit with the second exposure light and irradiating the second resist film of the second substrate held by the substrate holding unit with second reflected light that is the second exposure light for irradiation reflected by the second front surface;
  (g5) after the step (g4), forming a second resist pattern by developing the second resist film; and
  (g6) measuring a line width of the formed second resist pattern,
  the step (g4) includes the step of:
    (g7) irradiating the second resist film with the second reflected light,
    in the step (g4), the step (g7) is repeated while a region of the main surface of the second substrate to be irradiated with the second reflected light is being scanned, and a focal position of the second reflected light is changed every time the step (g7) is repeated, and,
  in the step (g), a third value is determined as a line width of the second absorber pattern so that a line width of the second resist pattern measured in the step (g6) is included in the first range, and the first value is determined by setting the determined third value as the first value.

\* \* \* \* \*